United States Patent [19]

Hartley et al.

[11] Patent Number: 5,016,011
[45] Date of Patent: May 14, 1991

[54] INCREASED PERFORMANCE OF DIGITAL INTEGRATED CIRCUITS BY PROCESSING WITH MULTIPLE-BIT-WIDTH DIGITS

[75] Inventors: Richard I. Hartley, Schenectady, N.Y.; Peter F. Corbett, Princeton, N.J.; Fathy F. Yassa, Clifton Park, N.Y.

[73] Assignee: General Electric Company, Schenectady, N.Y.

[21] Appl. No.: 482,121

[22] Filed: Feb. 20, 1990

Related U.S. Application Data

[60] Division of Ser. No. 347,860, May 4, 1989, abandoned, which is a continuation-in-part of Ser. No. 204,792, Jun. 10, 1988, abandoned.

[51] Int. Cl.$^5$ .............................................. H03M 9/00
[52] U.S. Cl. ...................................... 341/95; 341/100; 341/101
[58] Field of Search .......................... 341/95, 100, 101

[56] References Cited

U.S. PATENT DOCUMENTS

| | | | |
|---|---|---|---|
| 3,765,013 | 10/1973 | Leibowitz | 341/101 |
| 4,023,144 | 5/1977 | Koenig | 341/101 |
| 4,377,806 | 3/1983 | Elliott et al. | 341/101 |
| 4,409,587 | 10/1983 | Scott | 341/101 |
| 4,447,804 | 5/1984 | Allen | 341/100 |
| 4,672,362 | 6/1987 | Furukawa et al. | 341/100 |
| 4,728,930 | 3/1988 | Grote et al. | 341/101 |
| 4,794,627 | 12/1988 | Grimaldi | 341/101 |

OTHER PUBLICATIONS

"Digital Circuit Optimization", C. E. Leiserson, F. M. Rose & J. B. Saxe, MIT Report (1982).
"Models for VLSI Circuits", F. M. Rose, MIT Master's Thesis (1982).
"Sehwa": A Program for Synthesis of Pipelines, N. Park & A. Parker, IEEE Proceedings of the 23rd Design Automation Conference (1986).
"The VLSI Design Automation Assistant: Prototype System", T. J. Kowalski et al., IEEE Proceedings of the 20th Design Automation Conference (1983).
"An Approach to the Implementation of Digital Filters" L. B. Jackson et al., IEEE Transactions on Audio Electronics, vol. AU-16, No. 3, pp. 413-421 (1968).
"A Bit-Serial VLSI Architectural Methodology for Signal Processing", R. F. Lyon, VLSI 81, Academic Press, 1981.
*VLSI Signal Processing: A Bit-Serial Approach*, P. Denyer & D. Renshaw, Addison Wesley Publishing Co., Inc., Reading, Mass. (1985) pp. 3-6 & 29-56.
"Digit Pipelined Arithmetic as Illustrated by the Paste-up System: A tutorial", M. J. Irwin & R. M. Owens, Computers, Apr. 1987, pp. 61-73.
"Custom Design of a VLSI PCM-FDM Transplexer . . .", R. Jain et al., IEEE Journal of Solid-State Circuits, vol. SC-21, No. 1, Feb. 1986, pp. 73-85.
"A Bit-Serial Silicon Compiler", J. R. Jasica et al., Proceedings of the International Conf. on Computer-Aided Design, ICCAD085, Santa Clara, CA, pp. 91-93 (1985).
"Radix-4 Modules for High Performance Bit-Serial Computation", S. G. Smith & P. B. Denyer, IEEE Proceedings, vol. 134, Pt. E, No. 6, Nov. 1987, pp. 271-276.
Techniques to Increase the Computational Throughput of Bit-Serial Architectures, S. G. Smith, M. S. McGregor, P. B. Denyer, Proceedings of ICASSP 87, pp. 543-546. Apr. 1987.

*Primary Examiner*—A. D. Pellinen
*Assistant Examiner*—Marc S. Hoff
*Attorney, Agent, or Firm*—Allen L. Limberg; James C. Davis, Jr.; Marvin Snyder

[57] ABSTRACT

Conversion apparatus is used to convert digital data words to a digit-serial data format wherein digit bit-width is optimal for subsequent processing of the digital data words. Optimization is with regard to throughput efficiency, a measure of integrated circuit performance proportional to throughput rate of integrated circuitry and inversely proportional to the area of that integrated circuitry, comprising processing circuitry and attendant conversion circuitry.

36 Claims, 26 Drawing Sheets

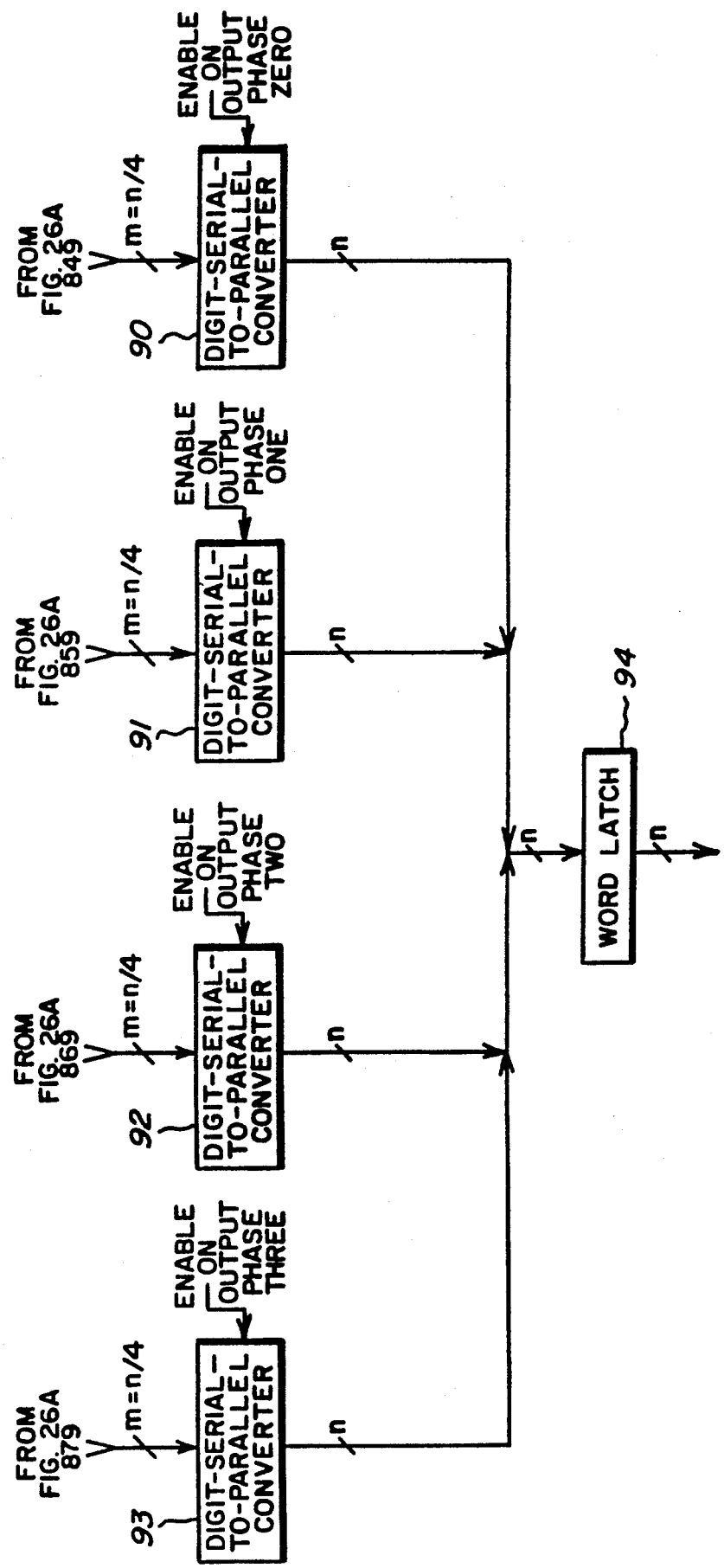

INCREASED PERFORMANCE OF DIGITAL INTEGRATED CIRCUITS BY PROCESSING WITH MULTIPLE-BIT-WIDTH DIGITS

This is a division of U.S. patent application Ser. No. 347,860 filed May 4, 1989, which is a continuation-in-part of U.S. patent application Ser. No. 204,792, filed June 10, 1988 now abandoned.

BACKGROUND OF THE INVENTION

The present invention is generally directed to a system for processing digital data in which data are processed in portions that are smaller than the word size, the size of the portions being optimally selected to maximize throughput efficiency, as that term is defined herein. More particularly, the present invention is directed to digital signal processing systems which are neither fully parallel nor fully serial in their architectures, but rather exhibit an intermediate architecture selected on the basis of optimizing a measure of performance based upon speed and circuit size.

The present applicants have discerned that in any given digital signal processing problem, optimal results in terms of throughput and chip real estate actually require an architecture which draws both upon serial and upon parallel computational philosophies. To this end, applicants have proven that, in general, optimal design requires the utilization of digit serial architectural circuit designs. In these designs, bits are grouped together in digits having 2, 3, 4, 5, 6 or more bits and these "parallel" digits are processed in serial fashion. Thus, in digit serial architecture, a data word is divided into a number of digits of fixed, but initially arbitrary width. Arithmetic data flow within the circuit is over digit-wide signal lines and is propagated with the least significant digit first. Thus, data arrives serially at each operator, one digit at a time. Arithmetic and logic operators perform digit-serial calculations on this data and provide digit-serial output.

In fully parallel (or word-parallel) digital signal processing architectures, all bits of a data word, n in number, are processed simultaneously by the circuitry. This architecture has the advantage of relatively high processing speed, but suffers from the disadvantage that fully parallel architectures for each bit of a word replicate circuit elements and interconnections between elements, each of which replications tends to consume a commensurate additional amount of die area in a monolithic integrated circuit. Interconnections between monolithic integrated circuits for parallel data are multi-wire and a considerable number of interconnection terminals or "pins" must be provided for each integrated circuit to implement those multi-wire connections.

On the other hand, fully serial digital signal processing architectures process one bit at a time in each clock cycle. These circuits have the advantage of simplicity, ease of design and, most importantly, they require minimal amounts of circuitry and so take up only a small amount of die area in a monolithic integrated circuit. Also single-wire interconnections between monolithic integrated circuits are made possible by serial digital signals, which is important when the restrictions upon the number of interconnection terminals or "pins" available for such connections are pressing. Within a monolithic integrated circuit the single-conductor interconnections between circuit elements tend to appropriate less chip area than the multi-conductor interconnections between elements that characterize fully parallel architectures.

Serial architectures also tend to exhibit a substantial amount of latency. That is, because of the serial design, a relatively large number of clock cycles can elapse between the time that an input bit is received and the time that output information related to the input bit is provided by the circuitry. However, circuit speed is generally sufficiently fast once the latency period has elapsed. Also, when a number of serial computations are to be performed in a data-flow pipeline, later computations can begin before earlier ones finish, which tends to reduce overall latency in the system. Accordingly, throughput is not so low as to preclude utilization of this architecture. The main advantage of serial computation is the need for only a small area for the processing elements and their electrical interconnections. The drawback, however, is that throughput is often lower than otherwise desired. Equivalent throughput can often be approached by more traditional non-pipelined Von Neumann architectures.

A widely used fully serial architecture employs bit-serial signals in which a serial stream of bits describes a succession of data words bit by bit, in order of increasing significance, where those data words represent two's complement numbers. This serial stream of data bits is accompanied by a signal indicating when one data word finishes and another commences, which signal can be a signal that is a ONE when the most significant bit of a data word occurs in the serial stream of data bits and that is otherwise a ZERO.

Data-flow pipeline architectures are recognized as being appropriate to the implementation of a large class of algorithms such as those that appear in digital signal processing applications. There have been two major approaches to data flow architecture, namely fully parallel and fully serial implementations. These architectures are discussed broadly above. Both of them have been studied extensively.

Many algorithms, especially in the areas of digital signal processing and graphics applications, have a constant throughput and can be performed with a constant latency. These algorithms are suitable for direct implementation in hardware using pipelined data-flow architectures. Unfortunately, many algorithms require more operations, and hence more individual operators than can be accommodated on a single very large scale integrated circuit (VLSI circuit) using fully parallel arithmetic or logic. On the other hand, bit-serial systems often do not provide a sufficiently high throughput. Furthermore, the structure of many algorithms makes it difficult to avoid these problems by decomposing the data processing so as to dispose different portions of the circuitry on separate integrated circuits.

Fully-parallel computational elements have been one of the main objects of study in computer arithmetic. Even with the advent of VLSI, fully-parallel computational elements ar not well suited to data-flow architectural treatment, however, because their replicated digital hardware causes a tendency towards excessive size (as measured with respect to utilization of chip area). Furthermore, the multi-conductor interconnections within an integrated circuit are difficult to route unless the die size is allowed to be larger than one would wish.

Nonetheless, much work has been done on pipeline optimization for flow graphs of parallel computational elements. These aspects have been described in the works of Leiserson and others. These works include *Digital Circuit Optimization* by C. E. Leiserson, F. M. Rose and J. B. Saxe (MIT Report 1982), *Optimizing Synchronous Systems* by C. E. Leiserson and J. B. Saxe (Proceedings of the 22nd Annual Symposium on the Foundations of Computer Science, 1981), and in *Models for VLSI Circuits* by F. M. Rose (MIT Master's Thesis, 1982). Work on pipeline optimization for the flow graph organization of parallel computational elements is also described in the article *Sehwa: A Program for Synthesis of Pipelines* by Nohbyung Park and Alice Parker (IEEE Proceedings of the 23rd Design Automation Conference, 1986). Usually, however, parallel computational operators are used in a different architecture where they are time shared. Sharing of the operators decreases the throughput of the circuit, however. For example, see the article *The VLSI Design Automation Assistant: Prototype System* by T. J. Kowalski and D. E. Thomas (Proceedings of the 20th Design Automation Conference, June 1983, pages 479–483).

Bit-serial computational models have also received attention. In particular, Jackson et al. and later Lyon have proposed a methodology which has essentially been followed for the design of at least three "silicon compilers". In this regard, see *An Approach to the Implementation of Digital Filters* by Leland B. Jackson, James F. Kaiser and Henry S. McDonald (IEEE Transactions on Audio Electronics, Vol. AU-16, No. 3, September 1968, pages 413–421) and the article *A Bit-Serial VLSI Architectural Methodology for Signal Processing* by Richard F. Lyon (VLSI 81, Academic Press, 1981).

In connection with fully-parallel computation in data flow architectures, a technique known to designers (particularly those engaged in the design of digital filters) is to employ plural-path networks for "plural-phase" or "polyphase" data processing. See the M. G. Bellanger, G. Bonnerot and M. Coudrese paper *Digital Filtering by Polyphase Network: Application to Sample Rate Alteration and Filter Banks.* (IEEE Transactions Acoustics and Speech Signal Processing, Vol. ASSP-24, No. 2, pages 109–114, April 1976). See also pages 79–98 of the R. E. Crochiere and L. R. Rabiner book *Multirate Digital Signal Processing,* copyright 1983 by Prentice-Hall, Inc., Englewood Cliffs, N.J. 07632. In plural-phase data processing a stream of digital words supplied at an original sample rate is considered to comprise a succession of cycles, each cycle containing a plurality p in number of successive words. The p words in each cycle are considered as separate phases of the cycle. These phases may be identified by the consecutive ordinal numbers zeroeth through $(p-1)^{th}$ assigned in accordance with occurrence of the words representative of those phases in the cycle. Each word phase is used to form a separate sample stream, the sample rate of which is one-$p^{th}$ that of the original sample rate; and calculations are performed at the lower sample rate on each of the sample streams. The results of these plural-phase calculations are then combined to generate results at the original sampling rate. Plural-phase data processing permits a relatively high throughput rate for a system, while calculations can be performed at reduced rates.

Another technique that is used by digital circuit designers to slow the rates at which data processing needs to be done is a procedure known as "banking". An operator that is to process a stream of data at a higher throughput rate is simulated by parallelly processing segments of that data stream in a plurality, p in number, of operators operating at a lower throughput rate one-$p^{th}$ as fast as the higher throughput rate. Successive segments of the data streams are displaced one sample word from each other in the banking procedure. When banking is employed in transverse filtering, each segment of the data stream spans the number of sample words in the filter kernel. The same filter kernel weights each segment of data to determine each successive sample word of filter response, and the component filter responses parallelly generated at the lower throughput rate are then sequentially polled at the higher throughput rate to supply the complete filter response at that higher throughput rate.

The present invention is particularly useful to those designers who employ software and hardware tools generally described as being "silicon compilers". These tools permit designers to specify arithmetic and logical functions in a relatively high level language, such as C or FORTRAN or a special hardware description language, and permit them to use the silicon compiler system to generate a set of masks which are employed in the fabrication of VLSI circuits that operate to carry out the function specified. For example, such silicon compilers are described in *VLSI Signal Processing: A Bit-Serial Approach* by Peter Denyer and David Renshaw (Addison-Wesley Publishing Company, Inc., Reading, Mass., 1985). Still other relevant material pertaining to silicon compilers may be found in *Digit-Pipelined Arithmetic as Illustrated by the Paste-Up System: A Tutorial* by Mary J. Irwin and Robert M. Owens (Computer, April 1987, pages 61–73). Other relevant material concerning silicon compilers may be found in the article *Custom Design of a VLSI PCM-FDM Transmultiplexor from System Specification to Circuit Layout Using a Computer-Aided Design System* by Rajeev Jain et al. (IEEE Journal of Solid-State Circuits, Volume SC-21, No. 1, February 1986, pages 73–85) and in the article *A Bit-Serial Silicon Compiler* by Jeffrey R. Jasica et al. (Proceedings of the International Conference on Computer-Aided Design, ICCAD085, Santa Clara, Calif., pages 91–93, 1985).

S. G. Smith and P. B. Denyer in a paper titled *Radix-4 Modules for High Performance Bit-Serial Computation* (IEE Proceedings, Vol. 134, Pt. E. No. 6, Nov. 1987, pages 271–276) present an outline of a number of methods for increasing the throughput of bit serial architectures. Among the methods mentioned therein is the pairing of bit-serial bits for parallel computation as radix-four digits. In this same regard, attention is also directed to the paper titled *Techniques to Increase the Computational Throughput of Bit-Serial-Architectures,* by Smith et al. (Proceedings of ICASSP 87, page 543, April 1987).

The Smith and Denyer articles are interesting also in regard to the radix-four adders and multipliers they describe for processing dual-bit digits, which can be modified to accommodate multiple-bit digits. Digit-serial addition and subtraction for plural-bit digits are described by R. I. Hartley and P. F. Corbett in U.S. patent application Ser. No. 265,210 filed Oct. 31, 1988, entitled "DIGIT-SERIAL LINEAR COMBINING APPARATUS" and assigned to General Electric Company. That application described structures for performing digit-serial comparison as well as programmed addition or subtraction, which structures can perform non-restoring division. Digit-serial multipliers suitable for plural-bit digits are known in the prior art. Such multipliers are also described by R. I. Hartley and P. F.

Corbett in U.S. patent application Ser. No. 134,271 filed Aug. 15, 1988, entitled "BIT-SLICED DIGIT-SERIAL MULTIPLIER" and assigned to General Electric Company; and in U.S. patent application Ser. No. 231,937 filed Aug. 15, 1988, entitled "BIT-SLICED DIGIT-SERIAL MULTIPLIER", and assigned to General Electric Company.

Of interest is the Irwin and Owens article *Digit-Pipelined Arithmetic as Illustrated by the Paste-Up System: A Tutorial* (cited above) with regard to its description of architecture using two-bit-wide signed digits to describe each arithmetic word. Signed digits are used to permit the more significant digits of a word to be supplied first. Signed digits introduce undesirable redundancy into arithmetic words, inasmuch as each digit carries its own sign indication, rather than one bit in each arithmetic word providing sign indication for the entire word. The use of signed digits undesirably impairs "throughput efficiency", because handling the redundancy in the signed digits requires either an increase in digital hardware or a reduction in throughput rate as compared to non-redundant arithmetics. "Throughput efficiency" is a measure of the relative performance of integrated circuits, which measure includes as factors the throughput rate and the reciprocal of the area of the digital circuitry required to support a particular operation or set of operations, for a given set of integrated-circuit design rules.

The present inventors perceive that the use of arithmetics that use non-redundant plural-bit digits including multiple-bit as well as dual-bit digits greatly expands the range of design alternatives, lying between fully parallel and fully serial architectures, that are available to the integrated circuit designer. One can design systems, using a small digit size where high throughput is not so stringent a requirement and the space available on an integrated-circuit die for digit hardware is at a premium, and using a larger digit size where higher throughput rate is necessary. One can change digit size to adjust to the number of pins available for interconnection between integrated circuits or to solve routing problems for connections within an integrated circuit die.

The particular arithmetic favored by the inventors is a digit-serial arithmetic in which each word is a two's complement number, of n bits, n being a positive integer that is a multiple of another positive integer m. The sub-multiple of m, is the number of bits in each digit of the word. The digits of a word are successively supplied to data flow architecture in order of their significance, least significant digit first and most significant digit last. The order of bits within digits is prescribed according to the significance of the bits within its digit. The sign bit is the most significant bit of the word and is contained in the last digit of the word. The flow of digits is accompanied by another signal that indicates how the flow of digits may be partitioned into individual words.

While the indication may be furnished during the first digits of words, the inventors find it is preferable to furnish the indication during the last digits of words. Different digit-serial operations may be controlled during the first digits of words and during the last digits of words, respectively. It is usually more economical of hardware to derive the former indications from the latter indications by unit digit-interval delay than it is to derive the latter indications from the former indications by $[(n/m)-1]$-digit-interval delay. Bit-serial processing may be considered to be a special case of digit-serial processing, where digit size is one bit wide.

SUMMARY OF THE INVENTION

A system for processing digital data that embodies the invention in one aspect thereof, comprises means for converting a parallel digital data stream signal having a width of n bits into a serial digital data stream signal having a width of m bits, where m is a plural number at least three and is less than n, preferably being a submultiple of n. The system further includes digit serial processing means which receives the m-bit data stream and processes this data in m-bit serial digits, the value of m being selected to substantially optimize "throughput efficiency" (a combined time and area optimization measure).

In a further aspect of the invention the system also includes means for receiving and for converting the digit-serial output from the processing means to a parallel data stream signal, again having a width of n bits.

Digit-serial computation using m-bit-wide digits can combine the advantages of bit-serial computation (small, fast digit-sized operators) with those of fully parallel computational architectures (high throughput). An aspect of the invention is optimally choosing the value of m to maximize the time and area measurement performance criterion referred to herein as "throughput efficiency", then placing digital input data in this format for processing. The fact that optimal throughput efficiencies are obtained by processing using multiple-bit digits has not been previously appreciated by those working in the art, the inventors believe.

Figure 11:
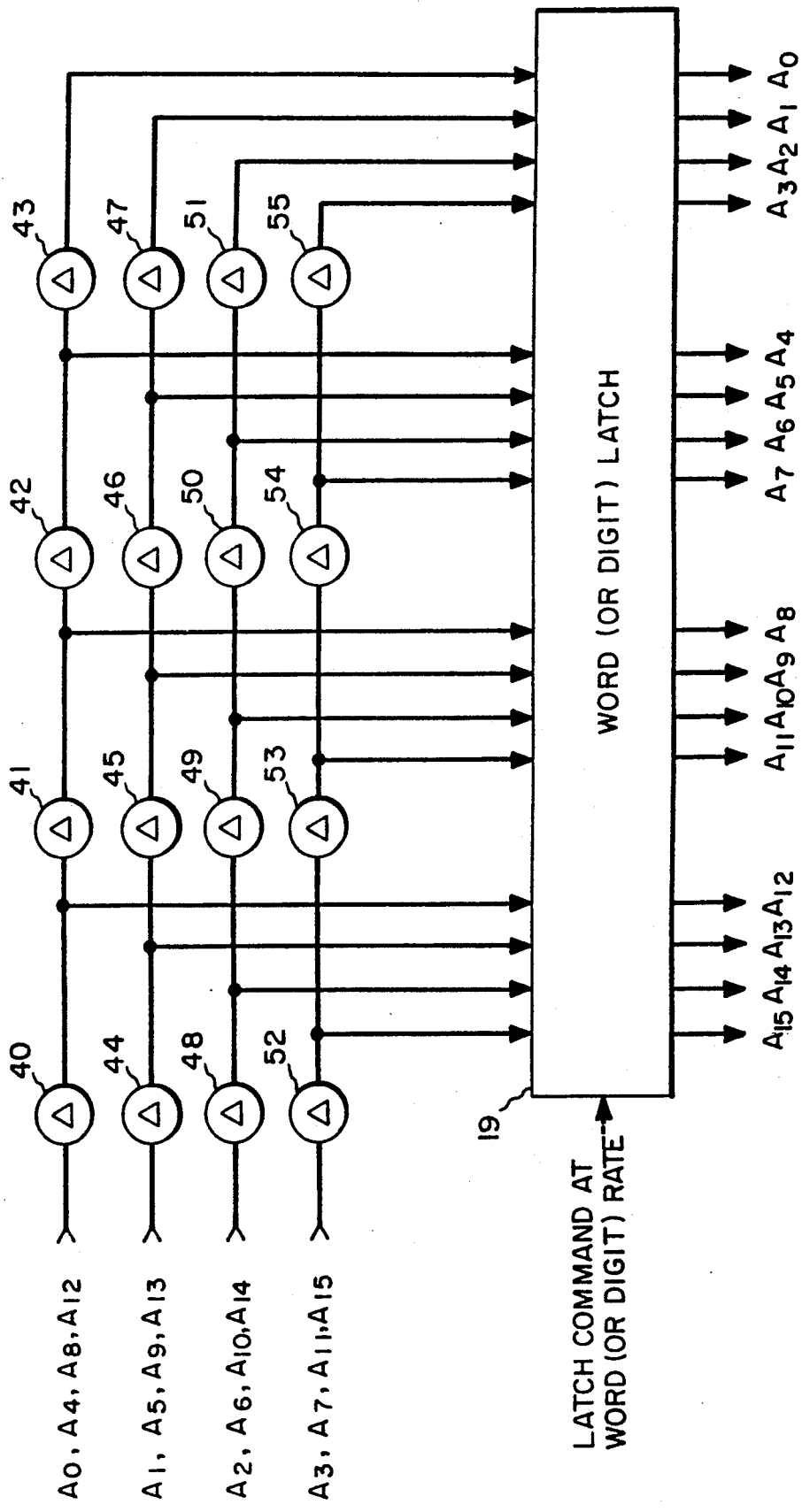

FIG. 11 is a schematic diagram of a digit-serial-to-parallel converter.

Figure 12:
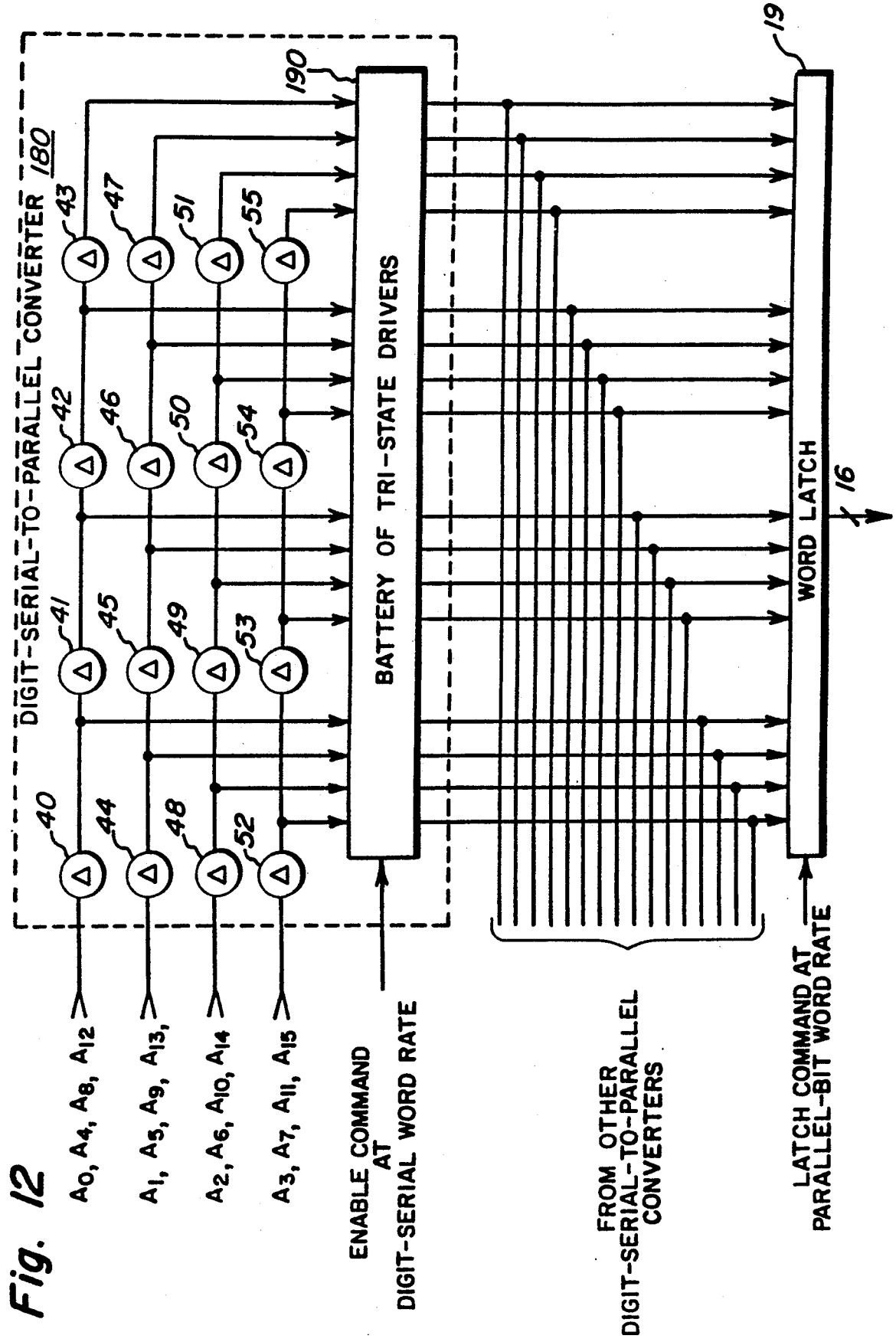

FIG. 12 is a schematic block diagram of another digit-serial-to-parallel converter, which is of particular use in polyphase filtering.

Figure 8:
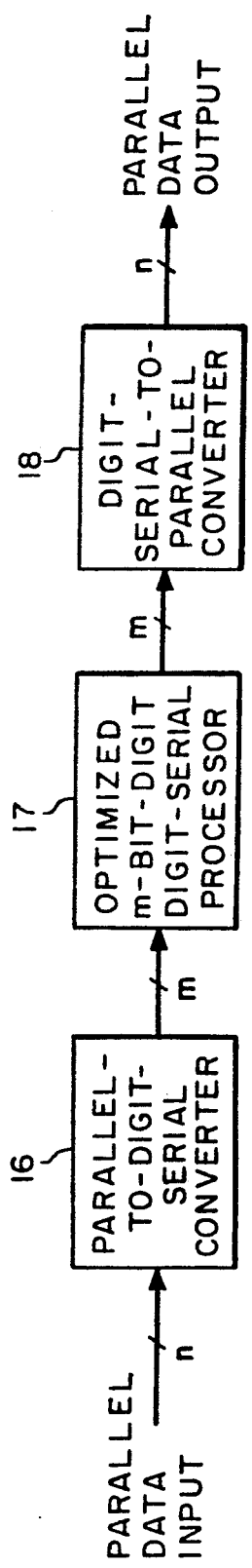
FIG. 8 is a schematic diagram illustrating a system wherein in accordance with an aspect of the invention parallel-to-digit-serial conversion and digit-serial-to-parallel conversion is employed in conjunction with an optimized m-bit-digit digit-serial processor.
Figure 13:
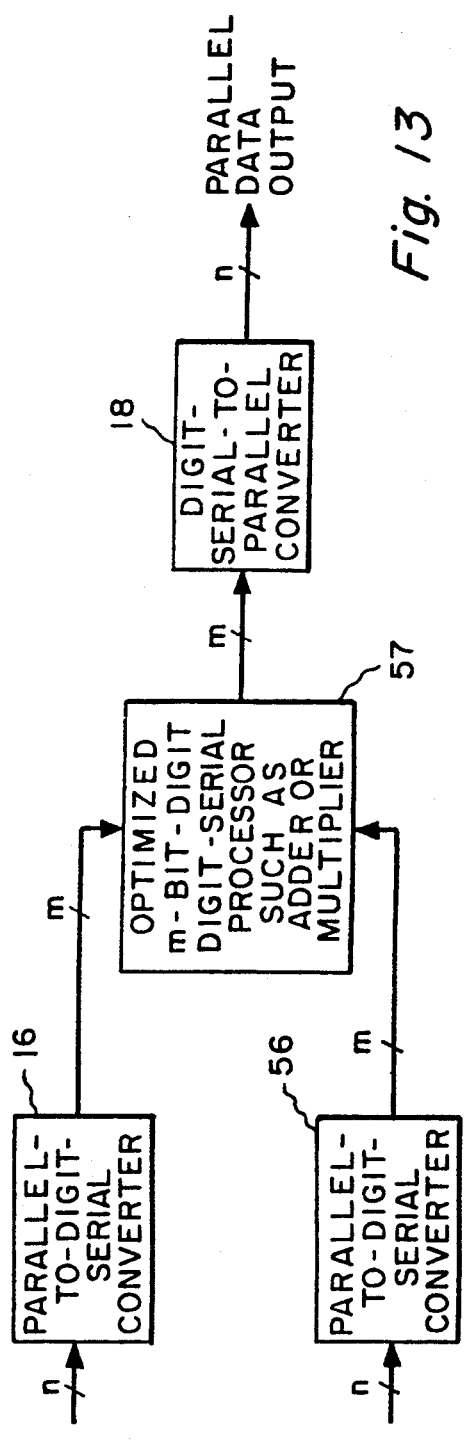

FIG. 13 is a schematic block diagram illustrating a system embodying the invention, which system is similar to that of FIG. 8 except for using an optimized m-bit-digit digit-serial processor having a plurality of input ports rather than a single input port.

Figure 14:
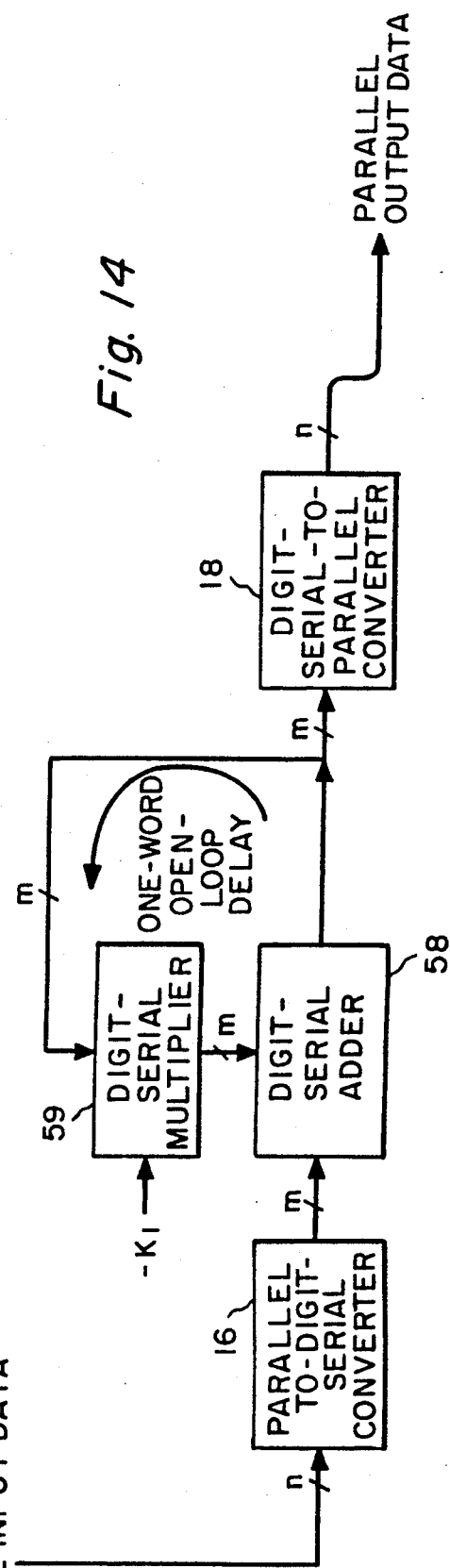

FIG. 14 is a schematic diagram of an infinite-impulse-response (IIR) filter, or recursive filter.

Figure 15:
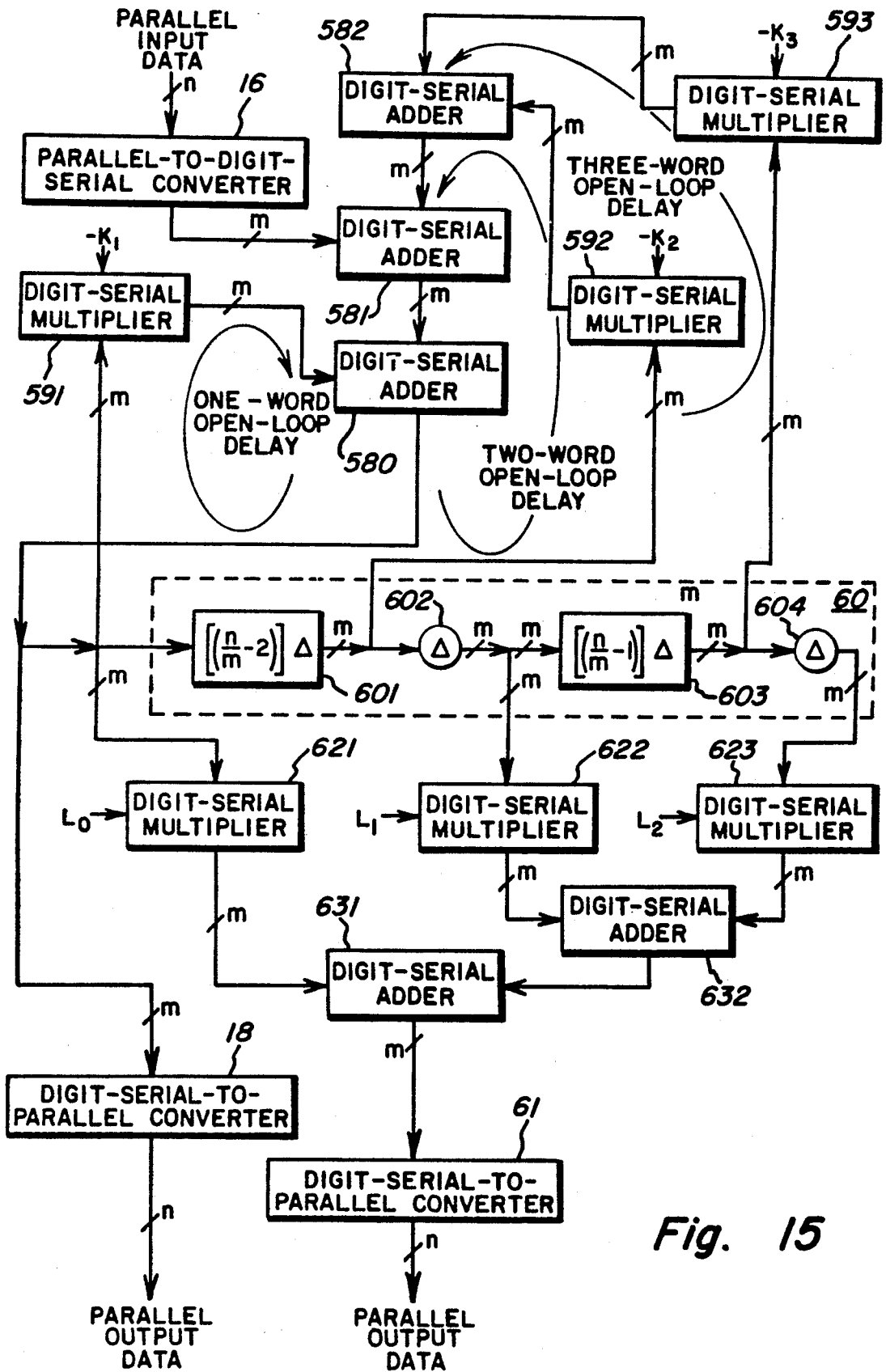

FIG. 15 is a schematic diagram of an output-weighted digital filter, having both poles and zeroes in a z-transform response thereof.

Figure 16:
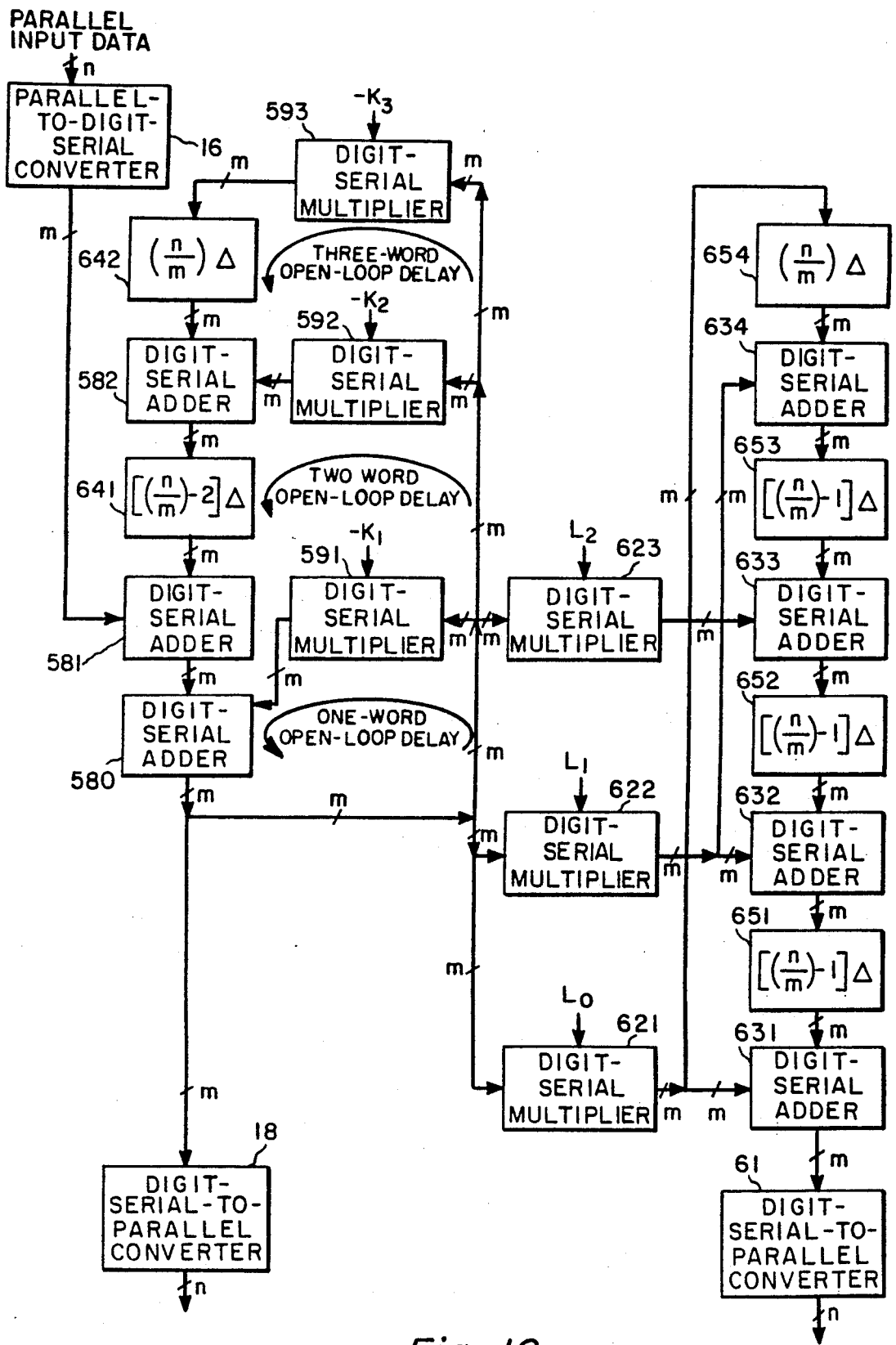

FIG. 16 is a schematic diagram of an input-weighted digital filter, having both poles and zeroes in a z-transform response thereof.

Figure 17:
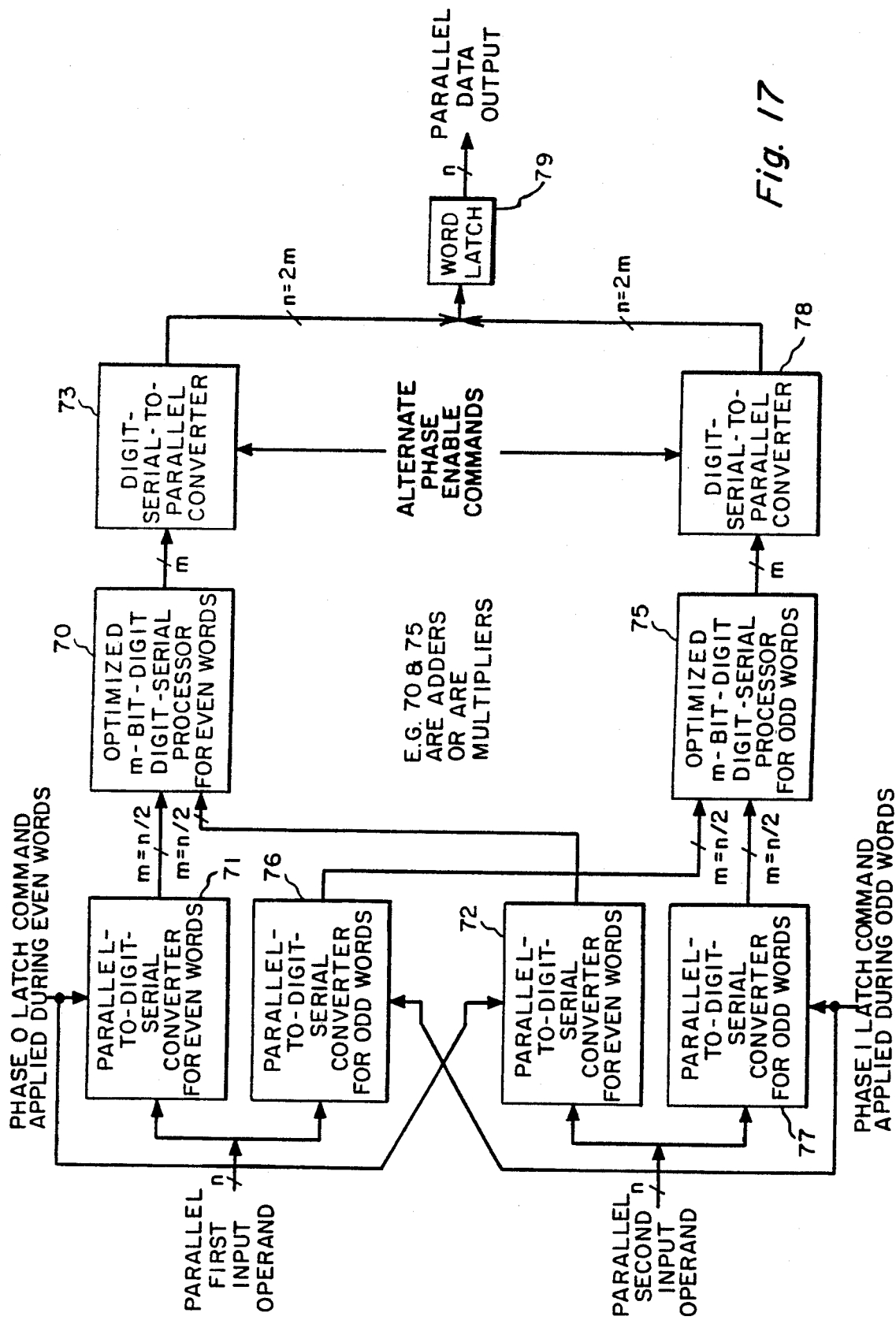

FIG. 17 is a schematic diagram illustrating an application of the present invention in which even and odd samples of a bit stream are separated into two bit streams for dual-phase data processing, performed on a digit-serial basis to optimize throughput efficiency.

Figure 18:
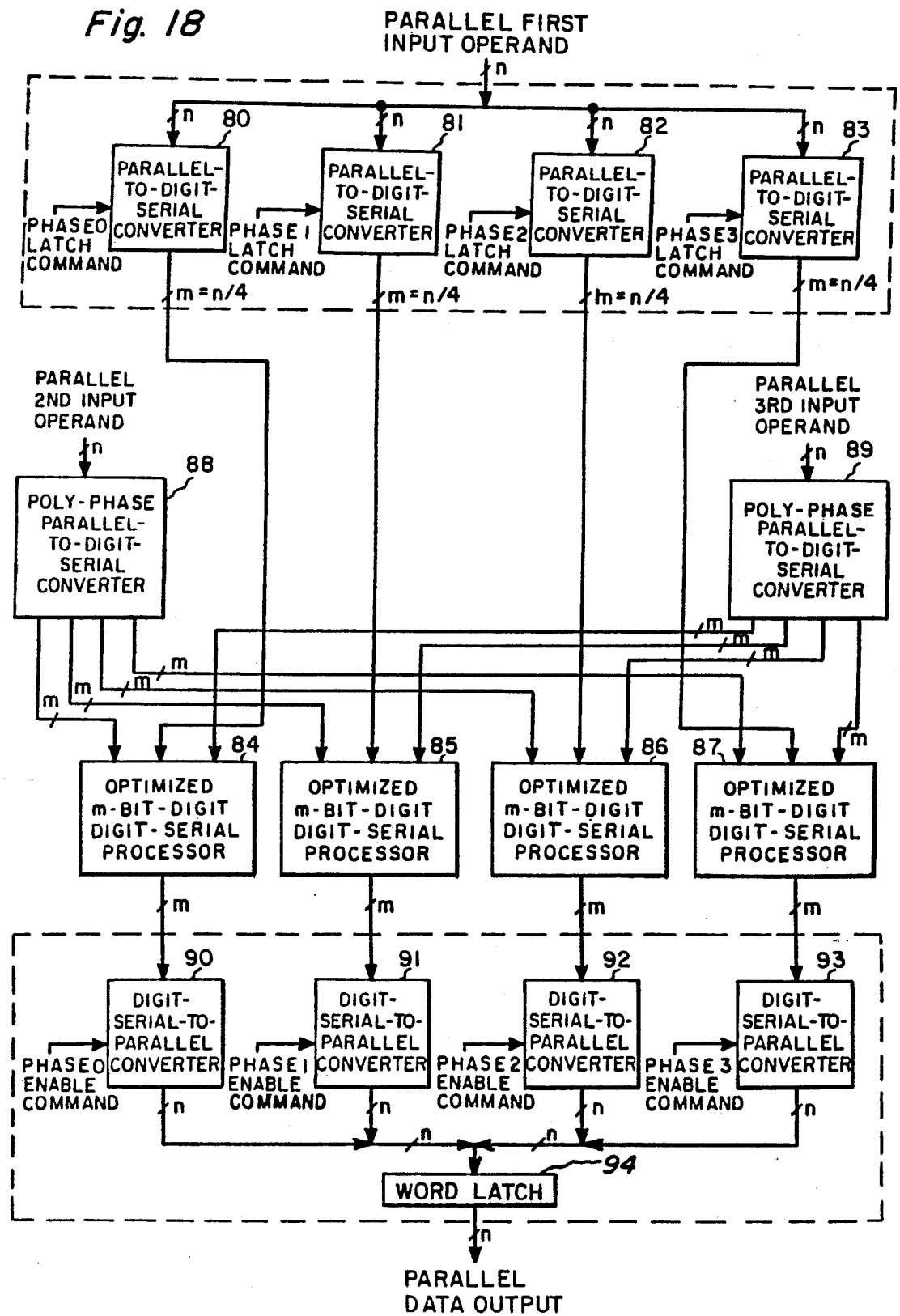

FIG. 18 is a schematic diagram of a system wherein polyphase data processing is implemented in accordance with an aspect of the invention.

Figure 19:
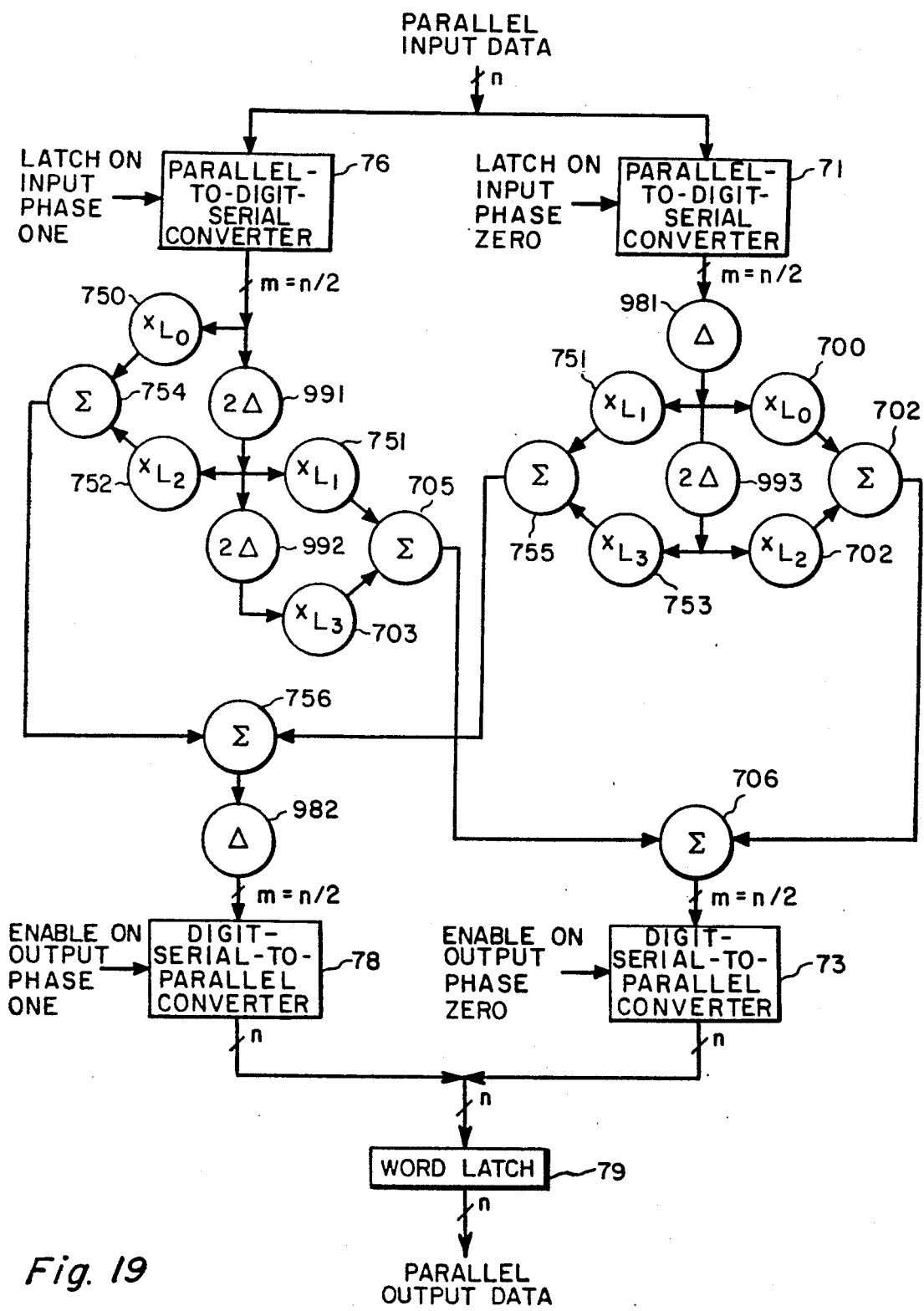

FIG. 19 is a schematic diagram of an output-weighted two-phase FIR digital filter with even number of samples in its kernel, which filter is constructed in accordance with an aspect of the invention.

Figure 20:
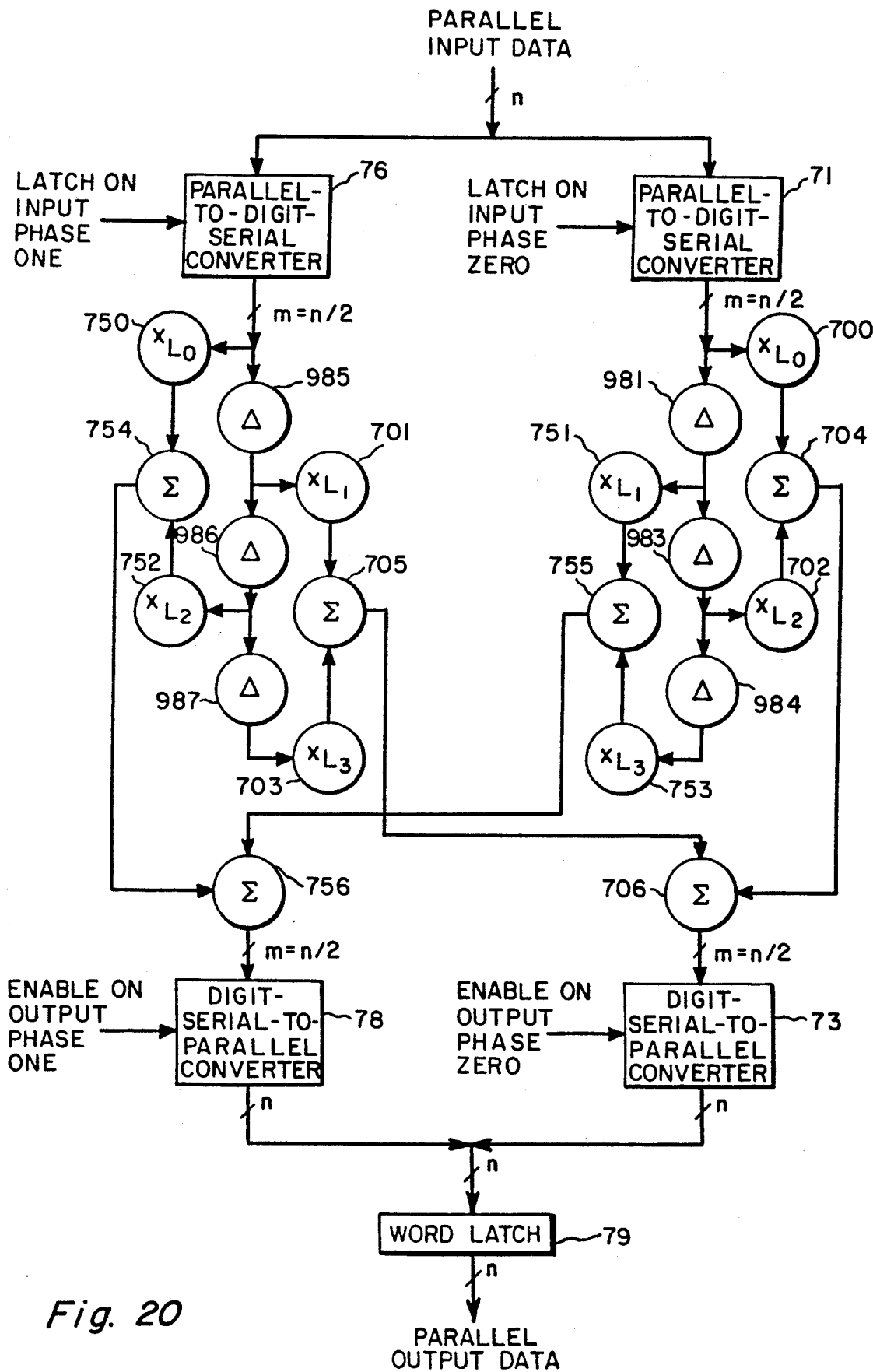
Figure 21:
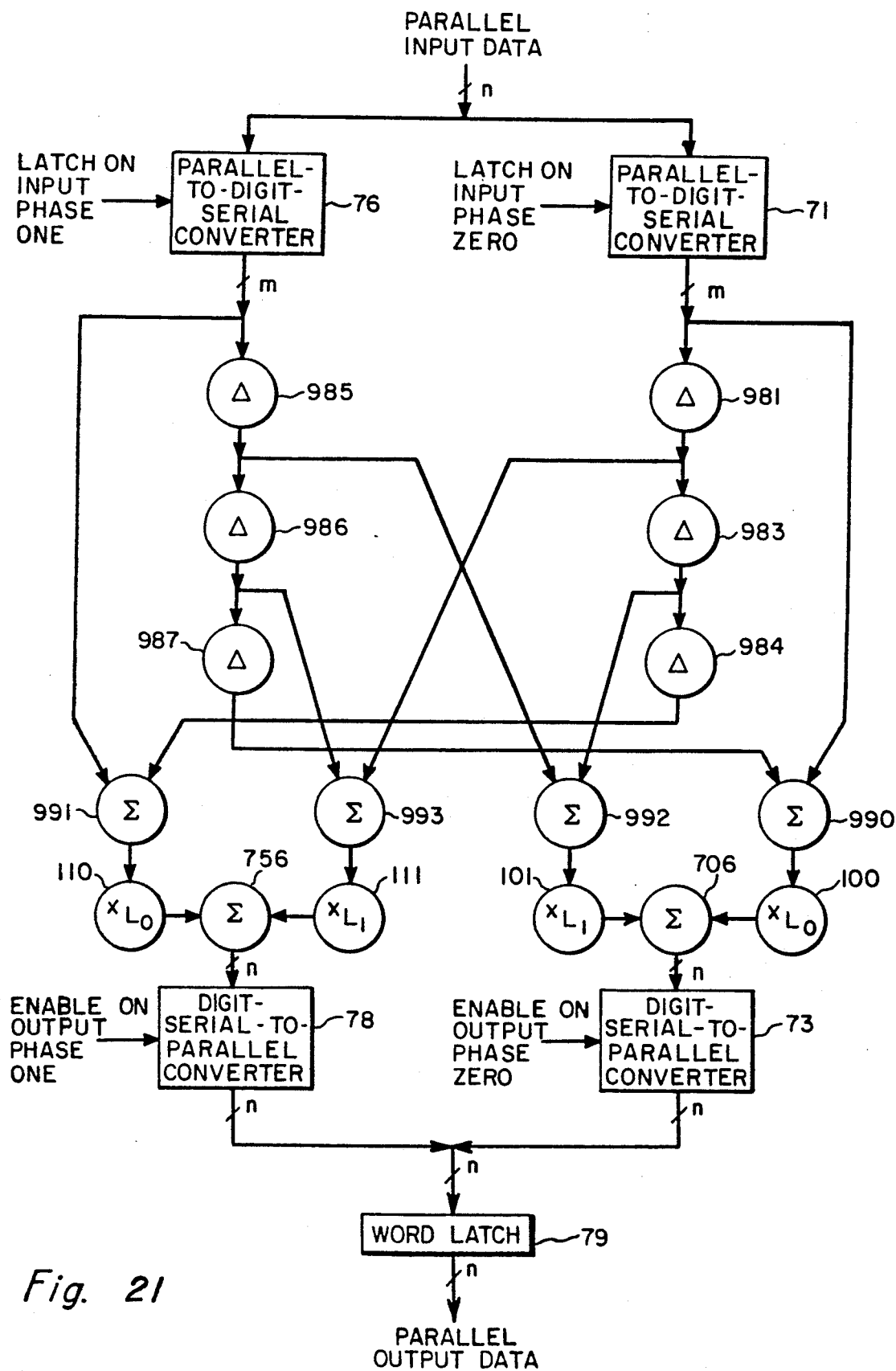

Each of FIGS. 20 and 21 is a schematic diagram of a modification of the FIG. 19 FIR filter which embodies an aspect of the invention, the FIG. 21 filter having linear-phase response.

Figure 22:
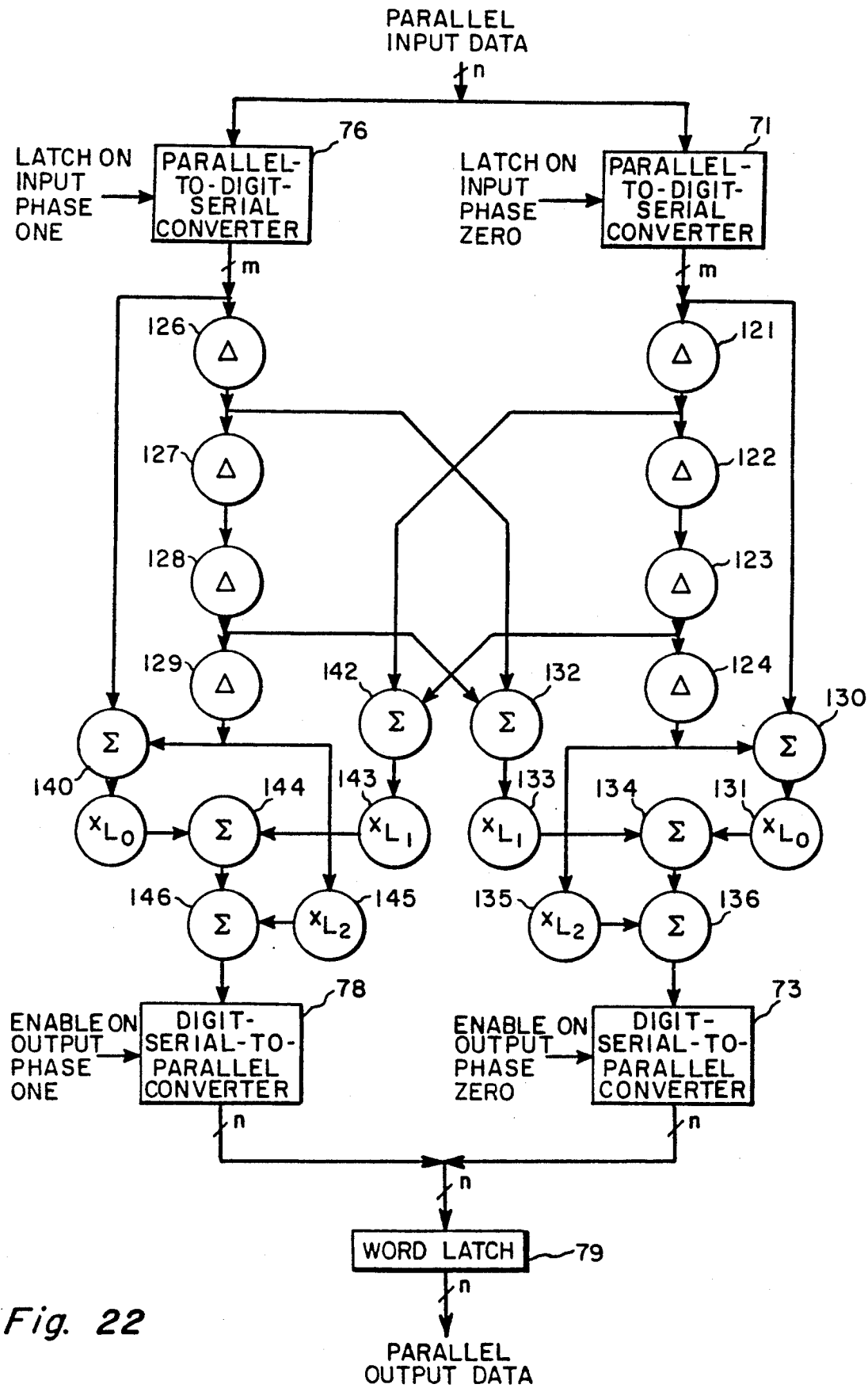

FIG. 22 is a schematic diagram of a two-phase linear-phase FIR filter with an odd number of samples in its kernel, which filter is constructed in accordance with an aspect of the invention.

Figure 23:
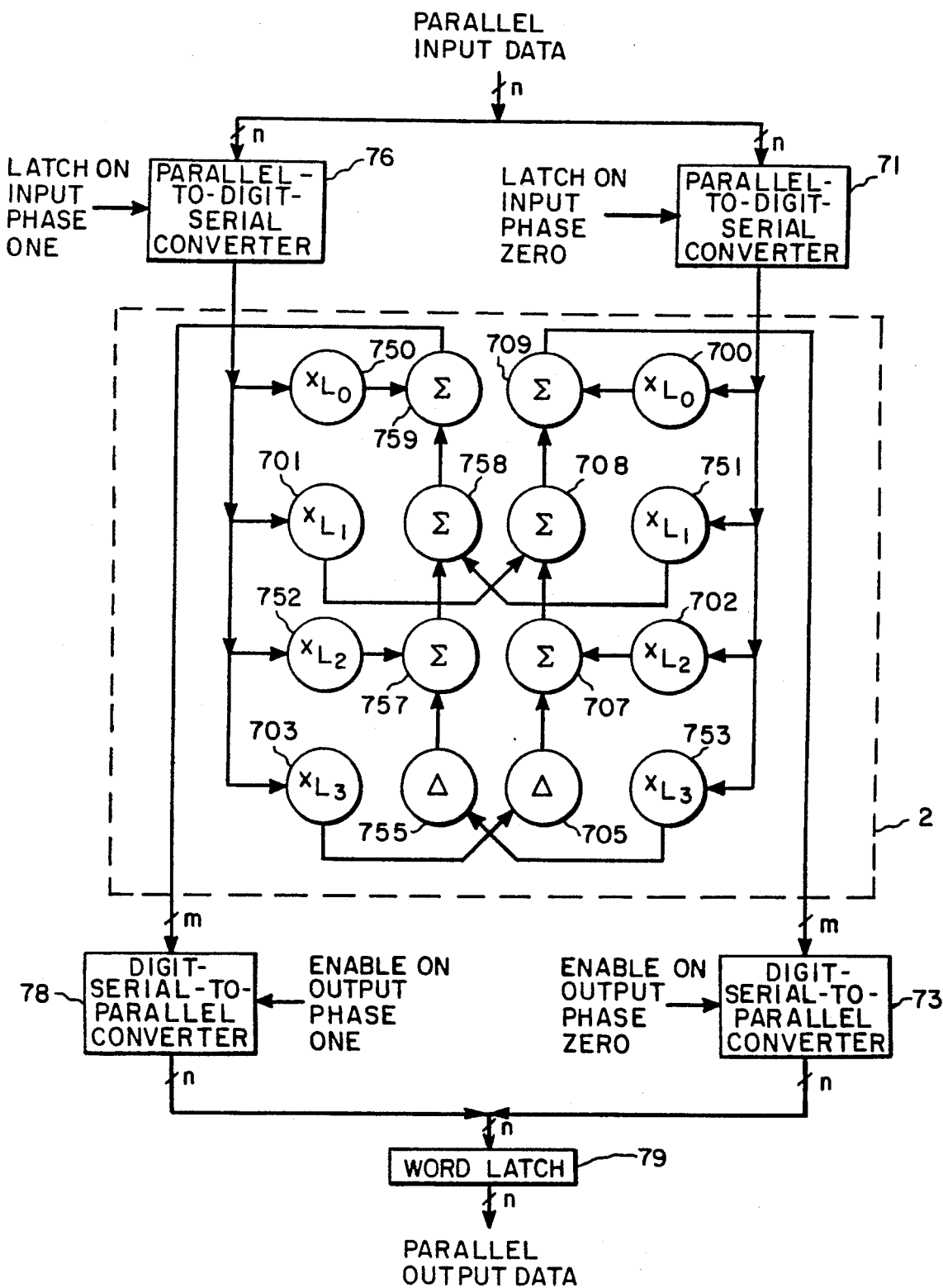

FIG. 23 is a schematic diagram of an input-weighted, two-phase, FIR digital filter having three zeroes in its z-transform system function, which filter is constructed in accordance with an aspect of the invention.

Figure 24:
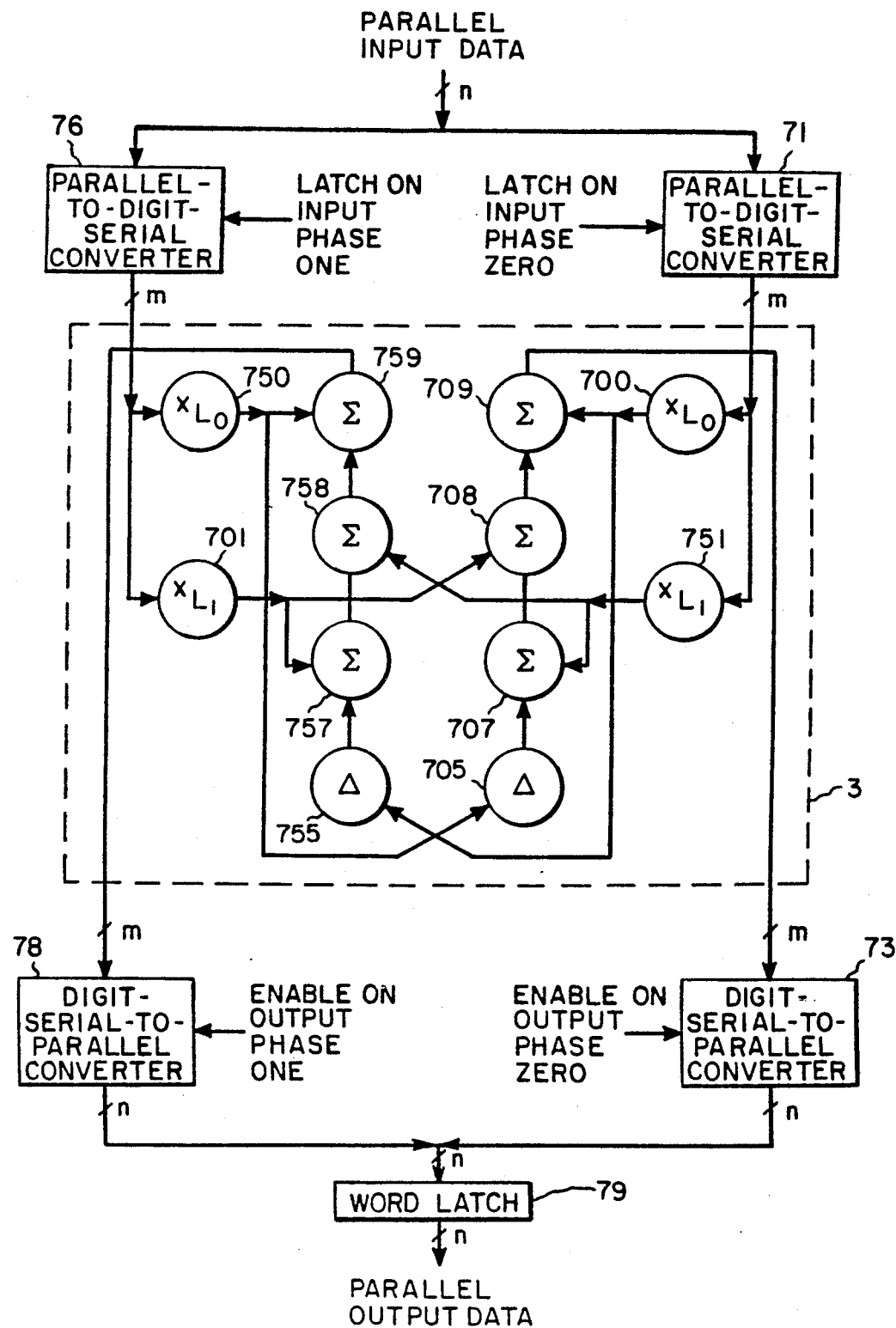

FIG. 24 is a schematic diagram of a linear phase input-weighted, two-phase, FIR digital filter having three zeroes in its z-transform system function, which filter is constructed in accordance with an aspect of the invention.

Figure 25:
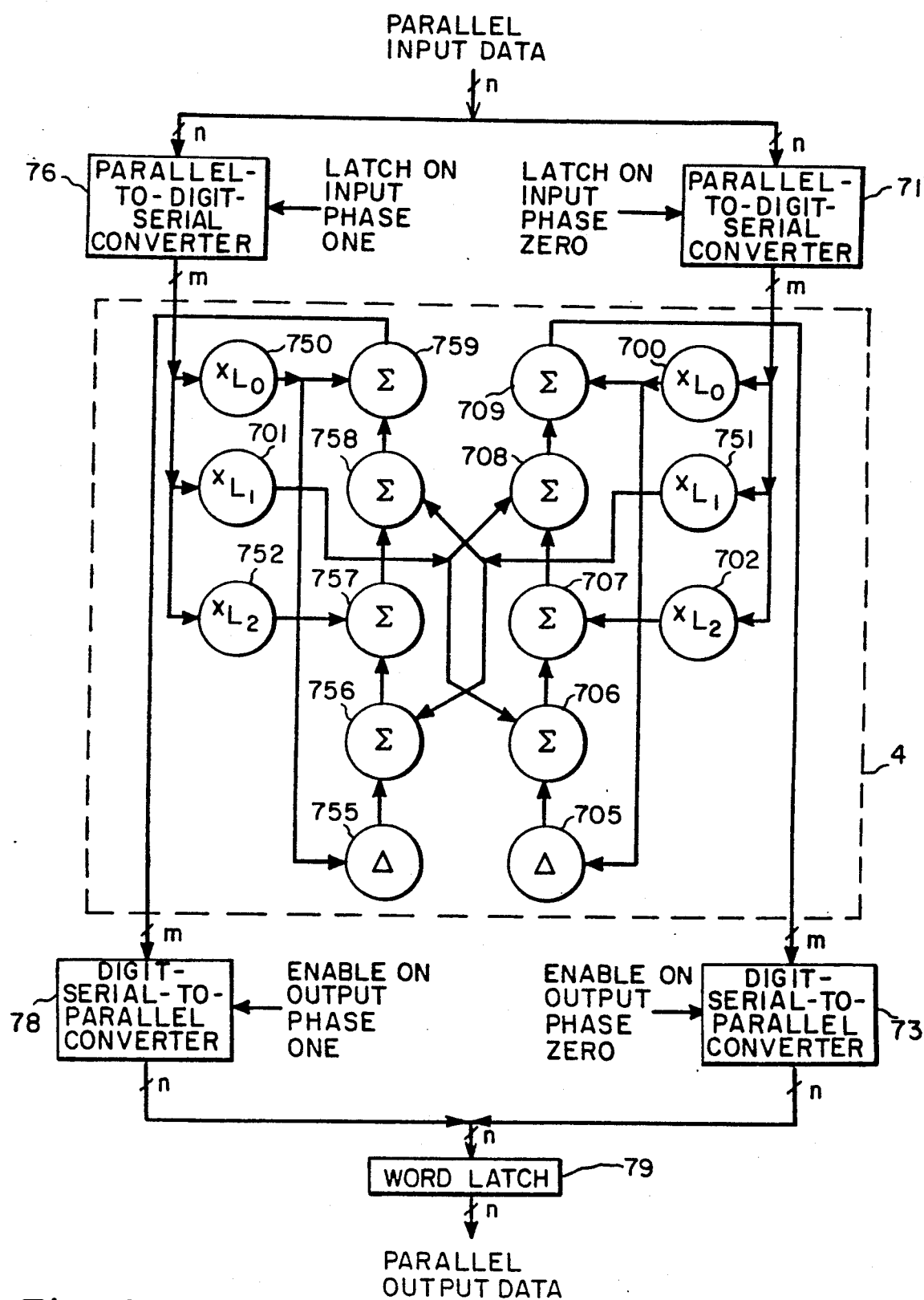

FIG. 25 is a schematic diagram of a linear-phase input-weighted, two-phase, digital FIR filter having four zeroes in its z-transform system function, which filter is constructed in accordance with the invention.

Figure 26A:
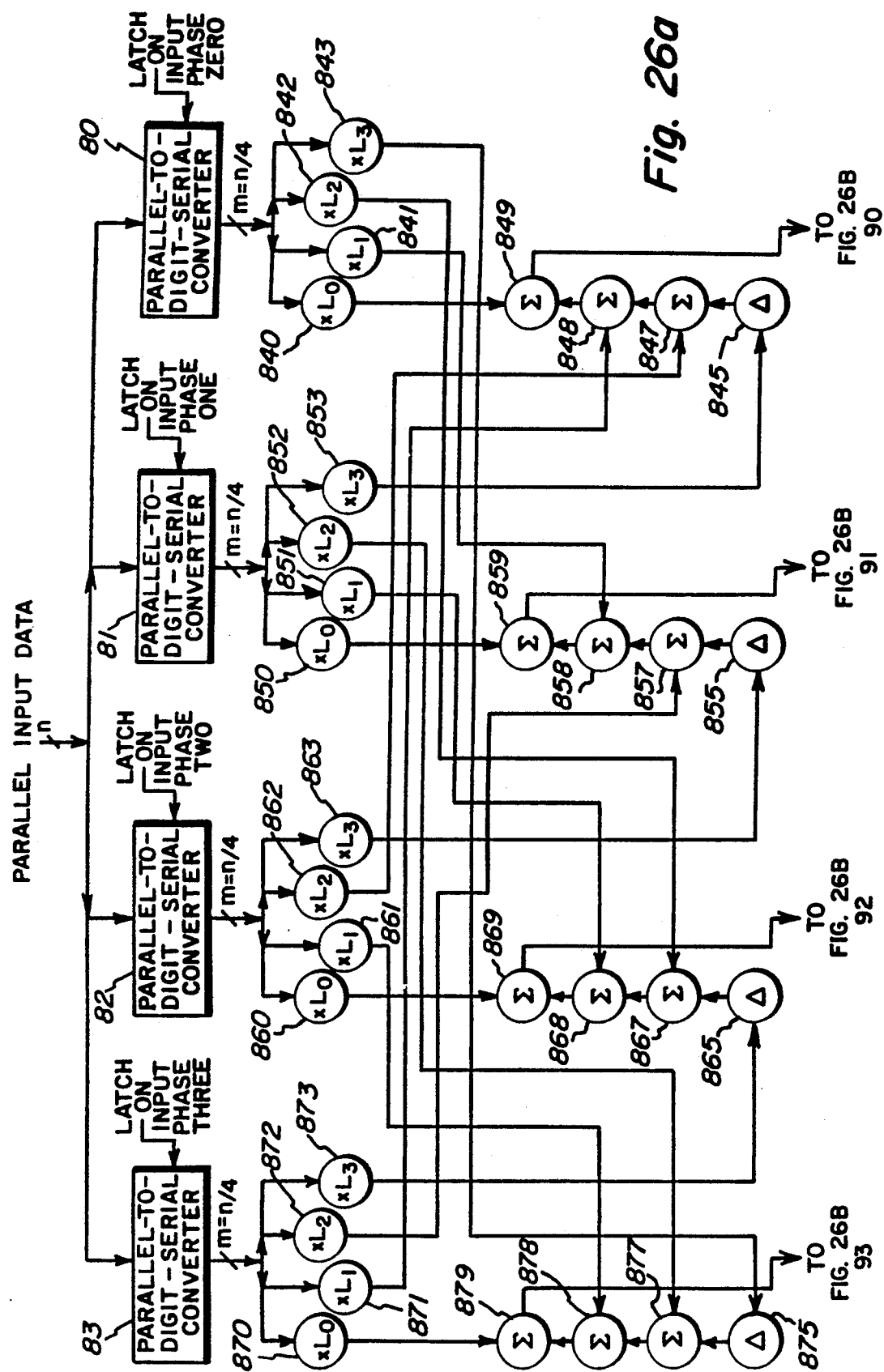

FIG. 26 is a schematic block diagram of linear-phase input-weighted four-phase FIR digital filter having three zeroes in its z-transform system function, which filter is constructed in accordance with an aspect the invention.

Figure 27:
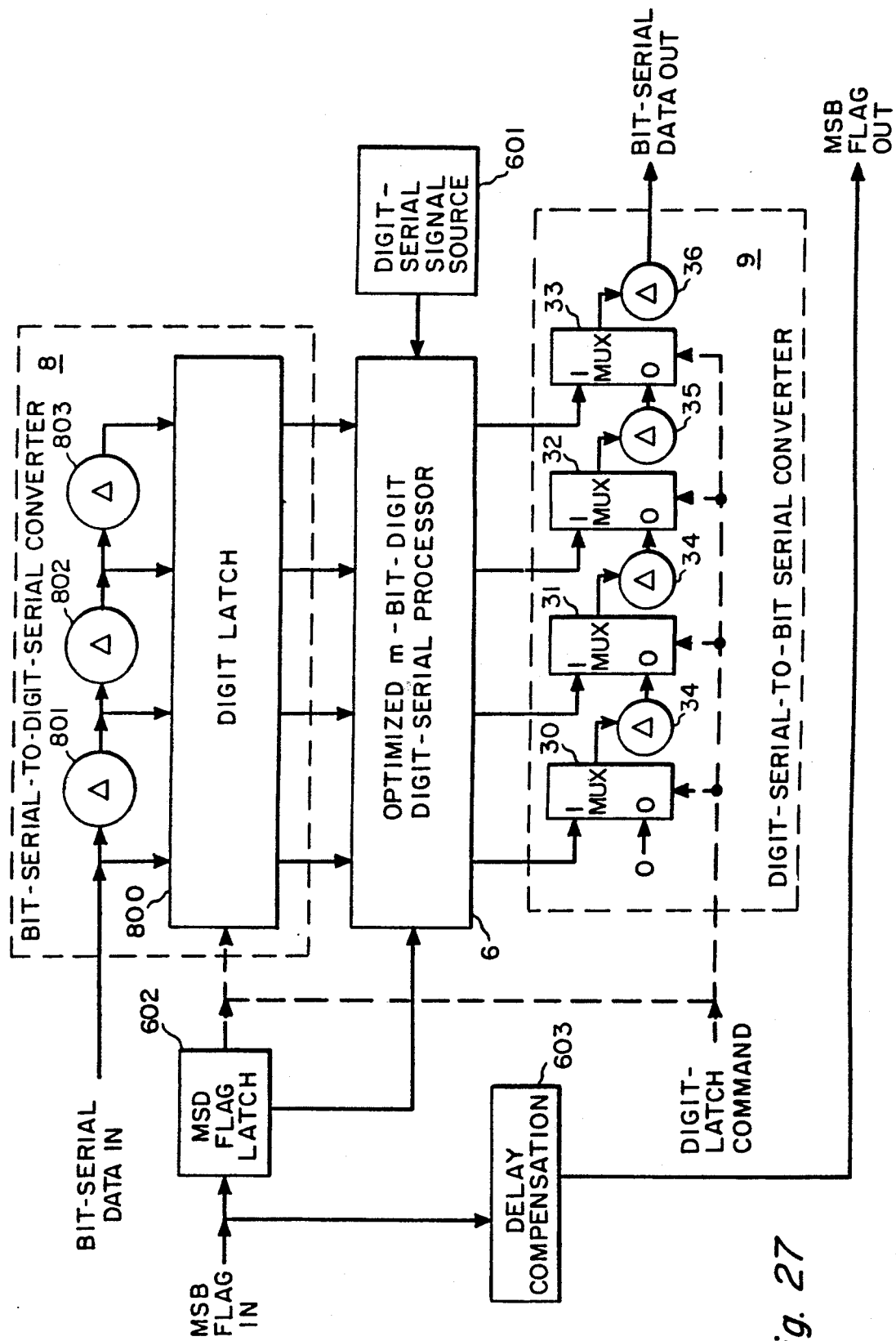

FIG. 27 is a schematic block diagram of a system wherein in accordance with an aspect of the invention bit-serial-to-digit-serial conversion and digit-serial-to-bit-serial conversion is employed with an optimized m-bit-digit digit-serial processor.

Figure 28:
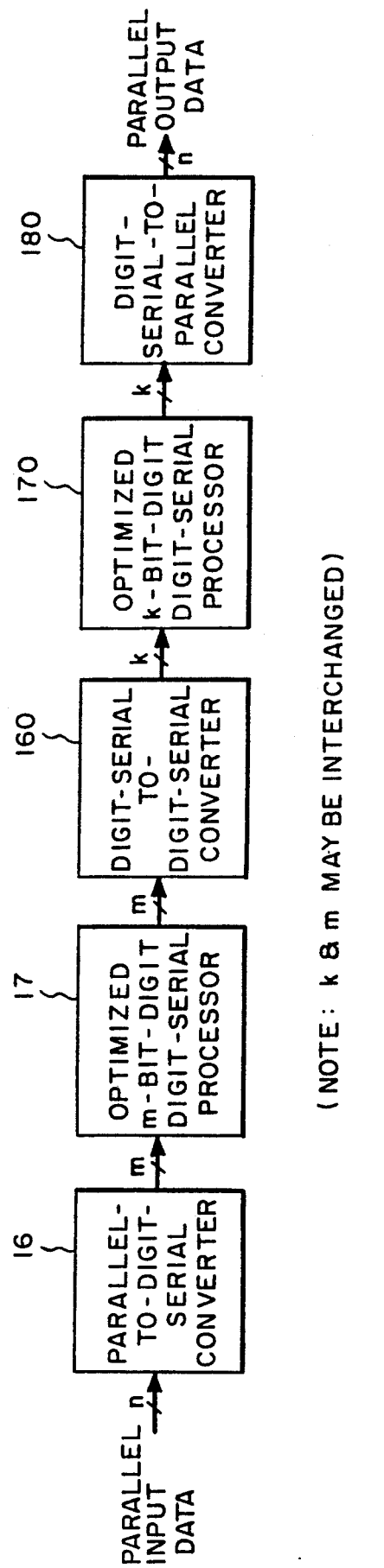

FIG. 28 is a schematic block diagram illustrating how two cascaded operations may be optimally performed by respective digit-serial operations employing different bit-width digits.

DETAILED DESCRIPTION OF THE INVENTION

Figure 1:
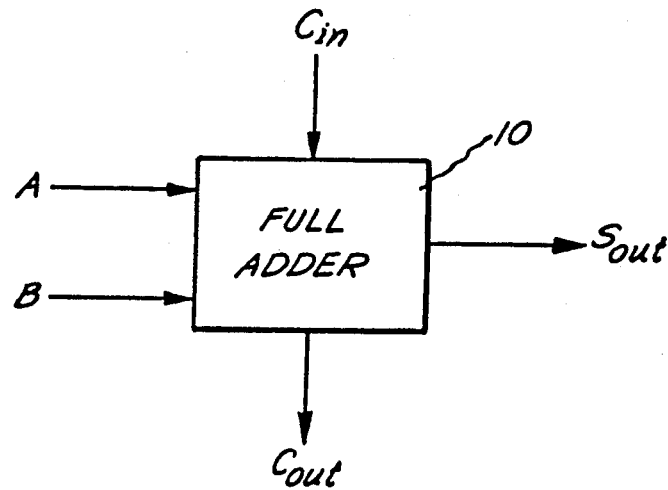
FIG. 1 is a diagram illustrating the input/output variables being employed in conjunction with full adder circuits.

The concepts underlying the present invention are best illustrated by an example. In particular, consideration is given to the addition of two 16-bit numbers. The basic functional unit for performing addition of binary digits is a one-bit full adder, such as that shown in FIG. 1. In particular, full adder 10 accepts two operand input bits A and B and produces an output bit $S_{out}$. Additionally, full adder 10 also accepts a carry input signal $C_{in}$ which is also used in generating the output sum $S_{out}$ and the carry output signal $C_{out}$ in accordance with the logic of binary arithmetic. Since the carry output signal is supplied to the next higher bit position, it is said to have weight two.

The addition of two 16-bit numbers requires that at least 16 addition operations be performed, and that the output carry of each addition be used as the input carry to a full adder which is performing addition of operand bits of the next higher weight. The fully parallel solution to this problem is to provide 16 full adders $10a$, $10b$, ..., $10p$ (chained together as far as ripple carry is concerned) to perform the addition of bits of all weights essentially simultaneously, as shown in system in FIG. 2. Here $A_0$, $A_1$, $A_2$, $A_3$, $A_4$, $A_5$, $A_6$, $A_7$, $A_8$, $A_9$, $A_{10}$, $A_{11}$, $A_{12}$, $A_{13}$, $A_{14}$ and $A_{15}$ are progressively more significant bits of a first sixteen-bit operand A and $B_0$, $B_1$, $B_2$, $B_3$, $B_4$, $B_5$, $B_6$, $B_7$, $B_8$, $B_9$, $B_{10}$, $B_{11}$, $B_{12}$, $B_{13}$, $B_{14}$ and $B_{15}$ are progressively more significant bits of a second sixteen-bit operand B. Since the carry output from one stage can affect the carry at the next stage, it takes a certain amount of time for the circuit to fully resolve the correct output, as the carry from each stage is finalized. The entire addition is usually thought of as occurring in one clock cycle.

Figure 2:
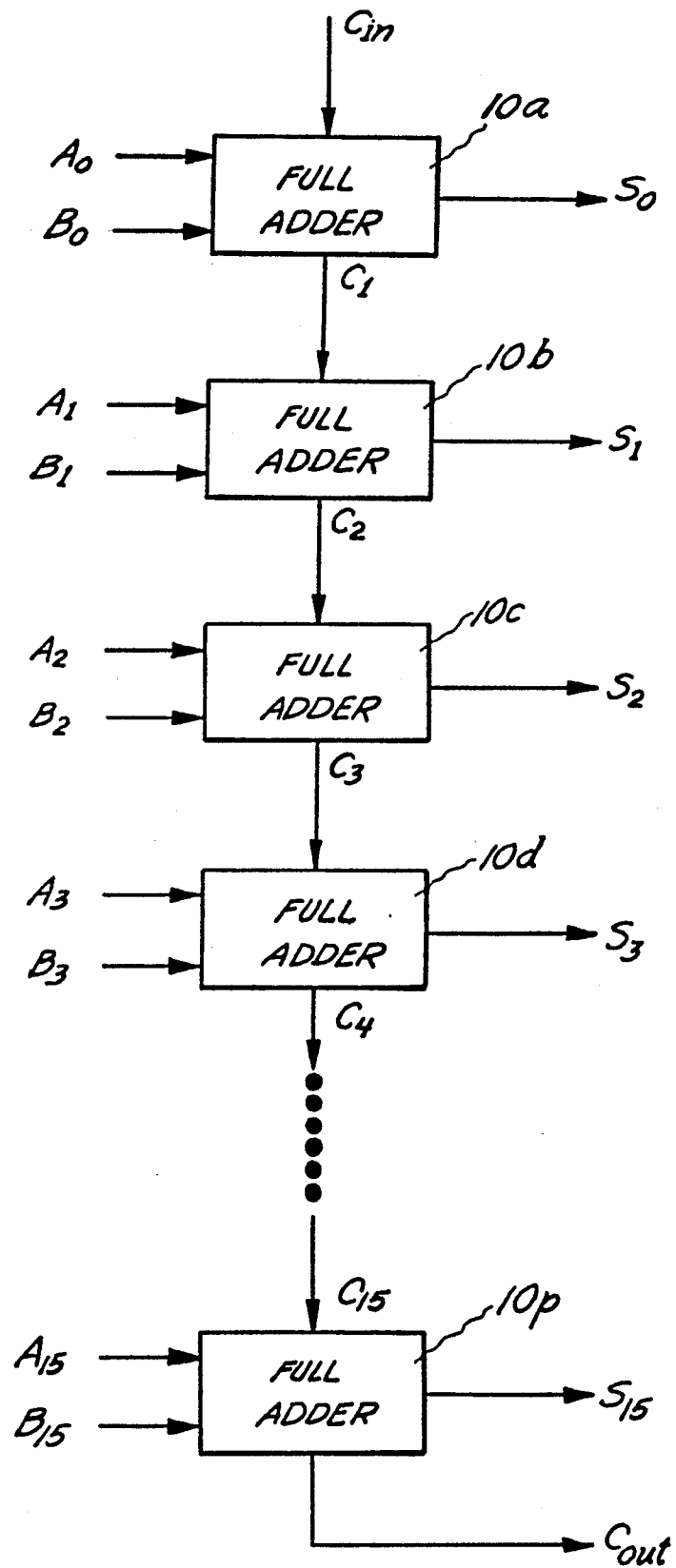
FIG. 2 is a schematic diagram illustrating the construction of a fully parallel adder circuit using individual full adder circuits such as those shown in FIG. 1.

It is noted that while there exist certain hardware solutions to speed up the circuit shown in FIG. 2, namely, carry look ahead circuits, the discussions of these mechanisms are not directly relevant to the present example. The ripple-carry adders being considered here are attractive as far as the design of circuitry using silicon compilers is concerned, because the structures tend to be repetitive in nature, using a simple general-purpose building-block circuit or basic cell over and over, rather than requiring special-purpose circuitry that would increase the number of cells maintained in the silicon compiler library.

Figure 3:
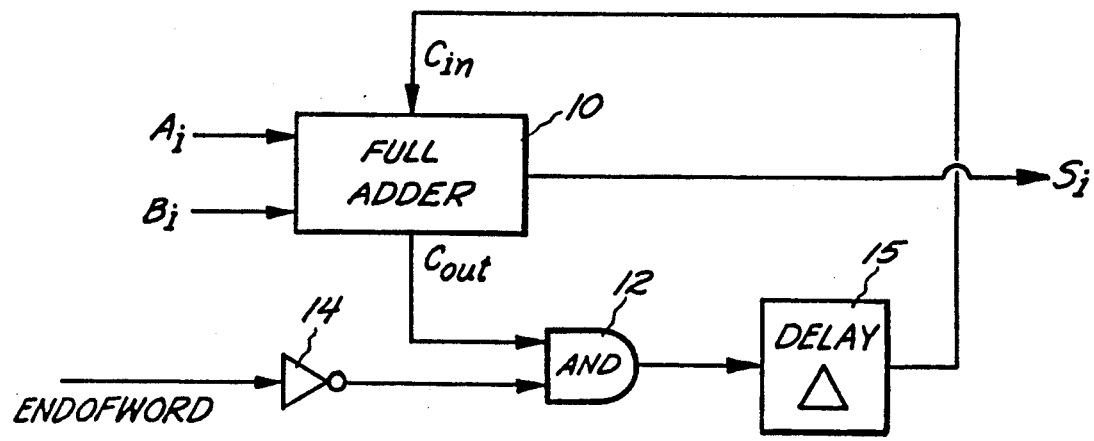
FIG. 3 is a schematic diagram illustrating the utilization of a full adder circuit and an associated delay circuitry used in the construction of a bit-serial adder.

In a fully serial approach to the binary addition problem, only a single full adder 10 as shown in FIG. 3 is needed block 15. In the fully serial approach, single full adder 10 shown performs all sixteen of the single bit additions. During each clock tick, a pair of input bits $A_i$ and $B_i$ which are to be added are provided along with a carry bit $C_{in}$ to full adder 10. Here, i is the number of the current one of a succession of clock bits sequentially identified by respective ones of a set of consecutive numbers. A single sum bit $S_i$ and a single carry bit $C_{out}$ are produced. The carry bit $C_{out}$ is applied to circuitry which includes AND gate 12 and a delay block 15. Delay block 15 which holds the bit for use as a carry input during the next clock tick, is a clocked bit latch, for example. (The delta symbol within a circuit block denotes a single-clock interval delay through that circuit block—i.e., a single digit delay of digit-serial data.) The sum bit $S_i$ is provided to the next operator in the pipeline, either immediately or after being held for one clock tick to increase the concurrency in the pipeline. A control signal, EndOfWord is a ONE during the last clock interval of a word and is used to mark the end of a word. This control signal is supplied to an inverter 14 which responds to supply a ZERO to an input of AND gate 12. This makes AND gate 12 non-responsive to the carry bit generated during the last clock interval of the word, so that the bit carried into the addition of the least significant bit position of the next pair of operands is a ZERO. Inverter 14, AND gate 12 and delay block 15 and their associated interconnections represent a certain amount of overhead in the structure of the operator in order for it to perform complete additions that is not present in fully parallel architectures. Thus, a fully serial operator is somewhat more than 1/16th the size of the fully parallel implementation.

A fundamental advantage obtained by using digit-serial computation is greater efficiency in the use of overhead circuitry and in the increase of operator throughput without going to a fully parallel solution. In particular, employing several full adders together with the overhead circuitry makes better use of this circuitry, while increasing the throughput of the operator by a factor nearly equal to the number of full adders now present. In the example shown, sixteen bit words can be added four bits at a time in four clock ticks, taking less than four times the circuitry of the fully serial implementation, but with nearly four times the throughput; or it could be added eight bits at a time in two clock ticks.

Figure 4:
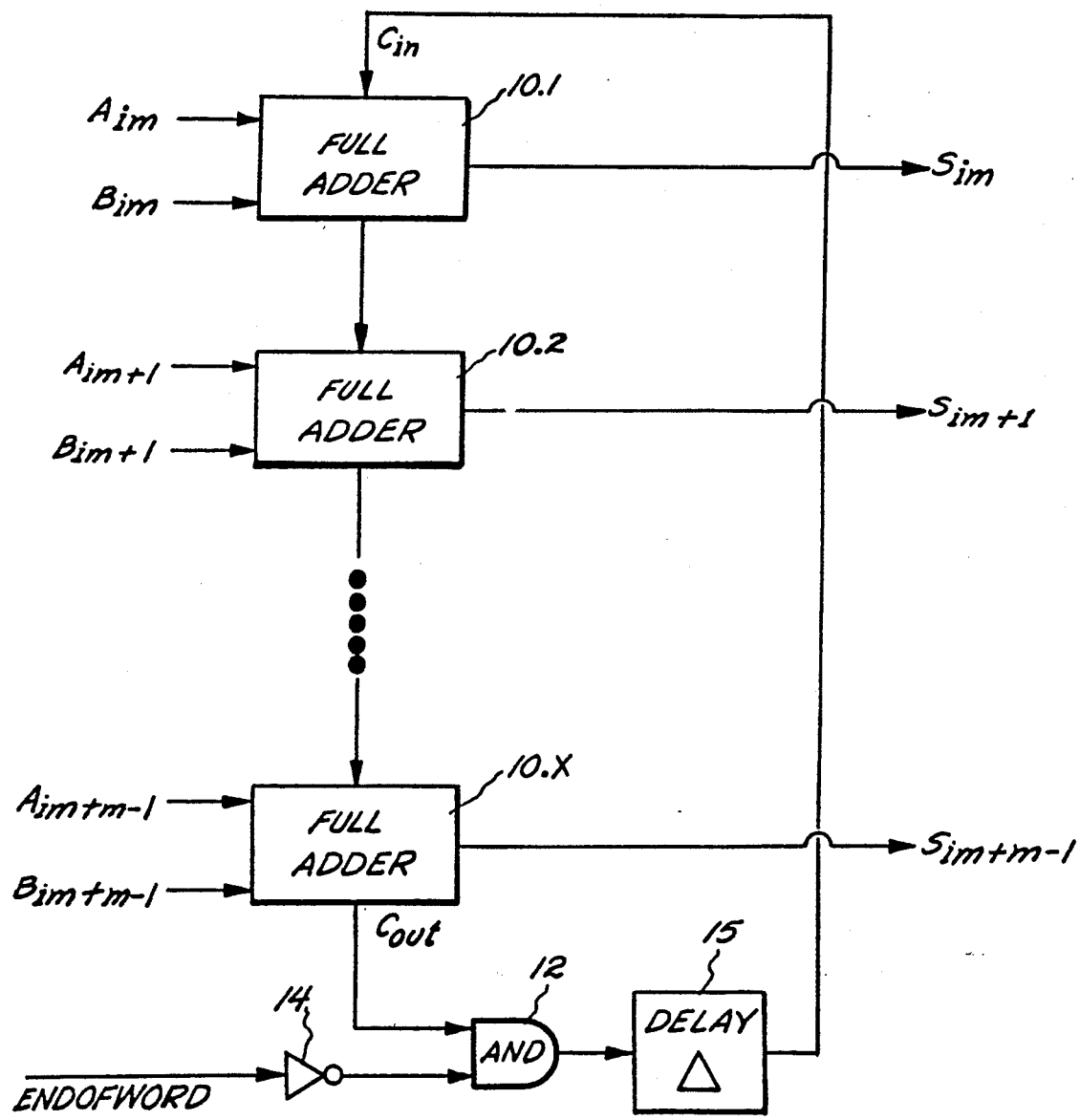
FIG. 4 is a schematic diagram illustrating an m-bit-digit digit-serial adder circuit in schematic block diagram form and particularly illustrating an intermediate architecture such as would be employed in conjunction with the present invention.

In this regard, attention is specifically directed to FIG. 4 in which an m-bit-digit digit-serial adder is shown. In particular, FIG. 4 is a hybrid of FIGS. 2 and 3. The m-bit-digit digit serial adder in FIG. 4 employs m full adders with ripple carry connections in a chain, similar to the ripple carry connections of n full adders in a parallel-word adder as shown in FIG. 2. However, in FIG. 4 the carryout signal, $C_{out}$, from the m full adders is supplied to an AND gate 12 and a delay block 15 in an arrangement similar to that shown in FIG. 3. Moreover, in FIG. 4, the output of delay block 15 is fed back through m levels of full adder circuitry to full adder 10.1, as shown. Thus, the circuitry shown in FIG. 4 performs the serial addition of an m-bit signal in the $i^{th}$ clock cycle. For purposes of clarification, it is noted that the subscripts illustrated in FIG. 4 are single, not double subscripts.

The FIG. 4 adder circuit can be modified to perform subtraction by replacing AND gate 12 and inverter 14 with an OR gate and by one's complementing one of the input operands A and B before its application to the full adders. It is also possible to selectively one's complement one of the input operands A and B using exclusive OR gates and to arrange a multiplexer for selectively performing the logic equivalents of the AND or OR gate; this permits selection of between addition and subtraction to be made response to single-bit control. Further particulars in regard to these latter connections are provided by R. I. Hartley and P. F. Corbett in the U.S. patent application Ser. No. 265,210.

Figure 5:
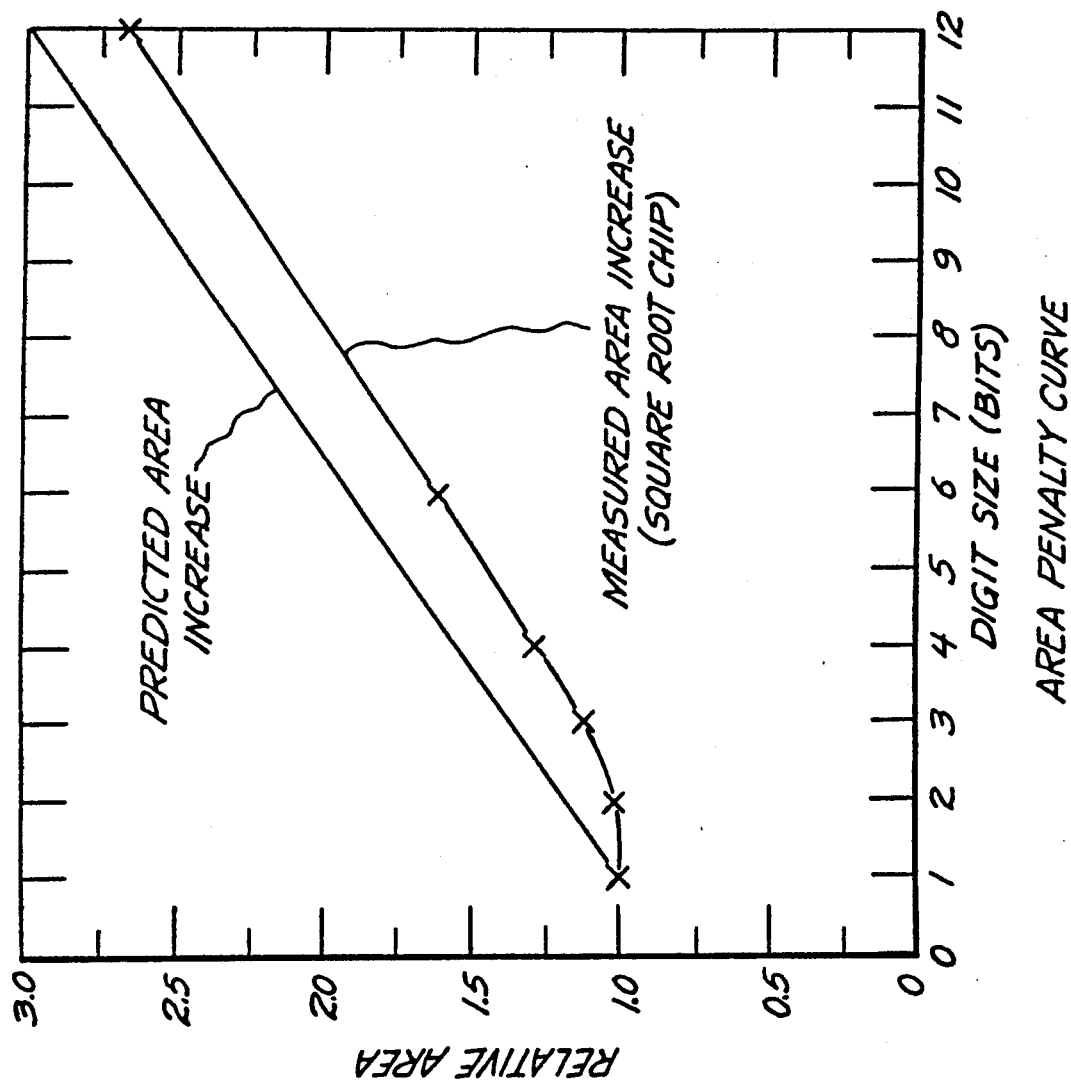
FIG. 5 is a plot of relative area versus digit size particularly illustrating the increase in chip area associated with higher digit size (more parallel computation).
Figure 6:
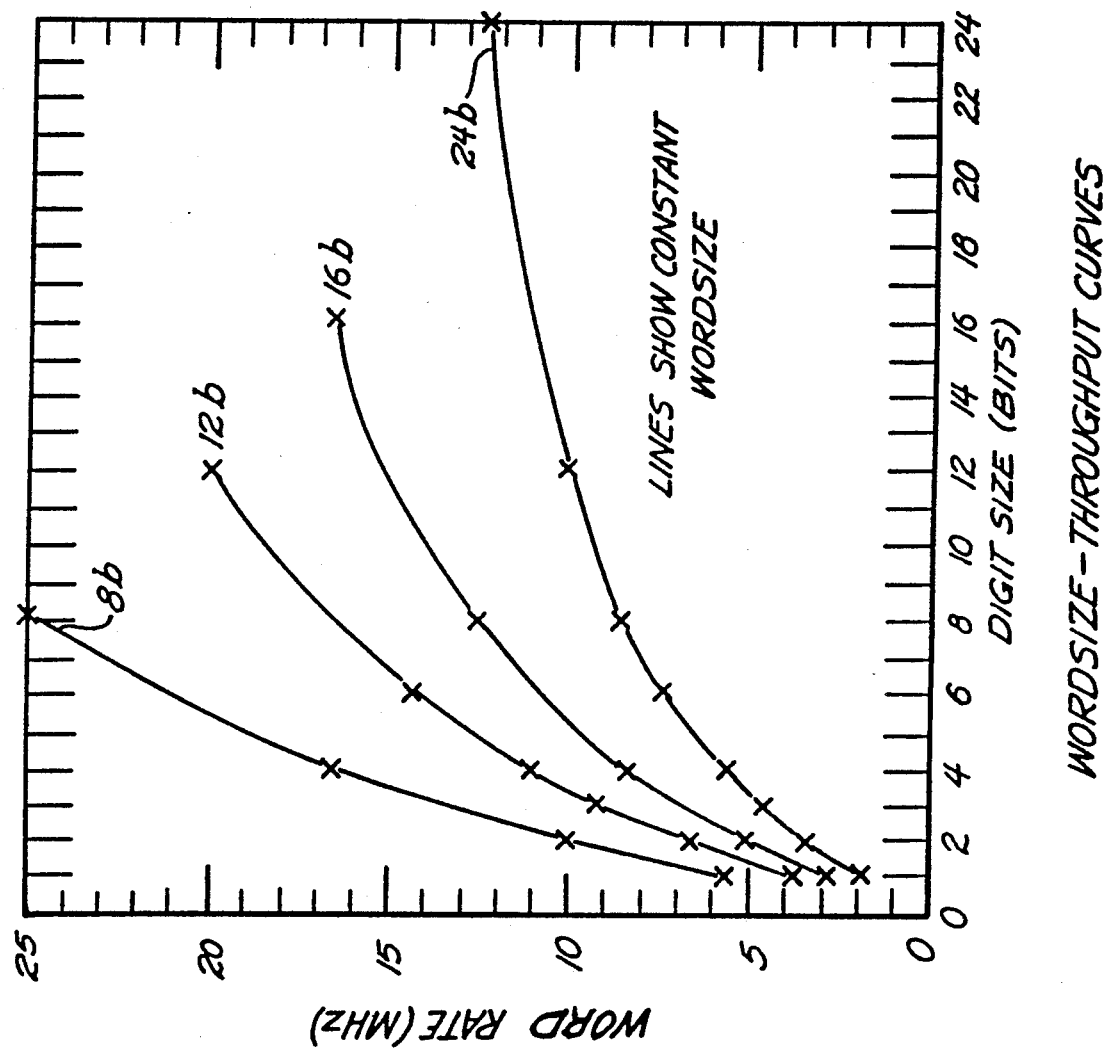
FIG. 6 is a plot of word rate as a function of digit size illustrating the fact that higher throughput is generally associated with increased digit size.
Figure 7:
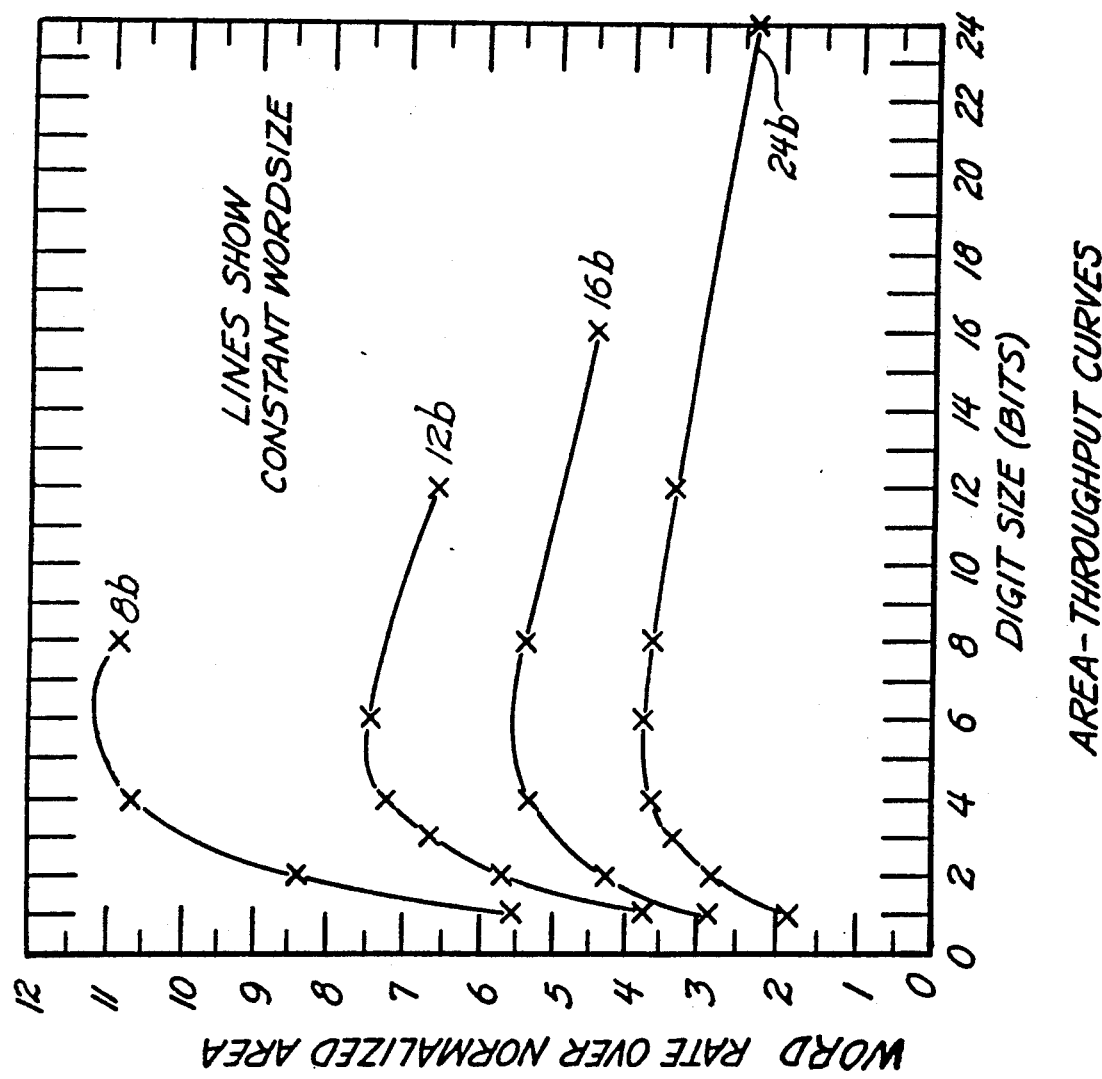
FIG. 7 is a plot of throughput efficiency (as defined below) as a function of digit size.

The output signals of the FIG. 4 adder can be applied to the input ports of clocked data latches (not shown) clocked at digit rate, and digit-serial adders described later on in the specification (after FIGS. 5, 6 and 7 are described in detail) are presumed to be provided with such latches and to have a delay of one clock interval therethrough.

While further on in this specification and in the claims the terms "augend" and "addend" may be used to refer to the digit-serial operands A and B, the digit-serial adders are essentially symmetric as to which of operands A and B is augend and which is addend, and this should be borne in mind when interpreting the meaning of these terms. When signed additions are performed, operands A and B may be alternatively thought of as minuend and subtrahend, rather than augend and addend.

A principal advantage of the digit-serial operation is that it can provide throughput which is nearly as high as fully parallel architectures can, but with a considerably smaller amount of circuitry. The key point to be considered to validate this aspect of the invention is that the actual time required by a clock tick must be increased as the size of the operator increases. In the case of a ripple-carry operator, this increase is linear. For example, consider the chip area, A and the time constant, T, of parallel and digit serial computational elements. The time constant T is the time required to complete the addition of two words. For the fully parallel sixteen bit adder, $A = 16f$, where f is the area of a full adder, and $T = 16r + t_0$, where r is the time for the completion of one bit of addition and $t_0$ is a minimum overhead time requirement. For an adder of half width, that is, an adder with a digit size of eight, $A = 8f + a_0$, where $a_0$ is an overhead area quantity (as associated with elements 12, 14, 15). In this case, $T = 2 \times (8r + t_0)$. If $t_0$ and $a_0$ were relatively small, then the half-width adder would provide an almost equivalent throughput to the full width adder while using just over half the area. In the general case, where the word size is n and the digit size is m, $A = mf + a_0$ and $T = (n/m)(mr + t_0) = nr + (n/m)t_0$. In actual practice, $t_0$ tends to be larger than r. E.g., r may be about 2.5 nanoseconds, and $t_0$ may be about 20 nanoseconds.

FIGS. 5 and 6 illustrate the way in which the area and throughput increase as the digit size of a circuit is increased, the word-size being held fixed. Values of f, r and $t_0$ have been chosen for these curves from realistic simulation and layout estimates. As can be seen, both throughput and area usage must increase as the digit size increases. The question to ask is which one of these increases is faster, if any. This question is answered below. More particularly, with reference to FIG. 5, it is seen that FIG. 5 is a plot of the relative area required by a circuit as a function of the digit size in bits. As can be seen from this figure, the increase is essentially linear. In particular, the predicted linearity is borne out by measured area increases observed in the fabrication of a square root chip, or at least the masks therefore, from utilization of a silicon compiler capable of employing a variable digit size. In a similar vein, FIG. 6 is a plot of the throughput, as measured by the sample rate in megahertz, as a function of digit size. In particular, this relationship is illustrated for a number of different word sizes ranging from an eight-bit word all the way up to a 24-bit word. As noted above, $T = nr + (n/m)t_0$, and $t_0$ tends to be larger than r. As (n/m) becomes larger—that is, as the number of digits per n-bit word increases—as long as $(n/m)t_0$ is substantially smaller than nr, there is a tendency for T to increase at substantially less than inverse proportion to digit size. But as n/m becomes larger, so $(n/m)t_0$ becomes larger than nr, T will tend to increase in almost inverse proportion to digit size.

FIGS. 5 and 6 illustrate the variation of certain key design parameters as a function of digit size. However, by themselves, either of these two measures merely illustrates the fact that a tradeoff is possible. There is no indication from either FIGS. 5 or 6 that optimal values of the digit size are possible. However, by introducing a standard metric for evaluating the efficiency of an operator, it is possible to show that optimal conditions do exist and do depend upon the digit size selected. In particular, the metric herein is the area-time product.

FIG. 7 shows this metric plotted for different word sizes as a function of the digit size. In particular, FIG. 7 shows throughput per unit area, $1/(AT)$, for different word sizes. Throughput per unit area is defined herein as "throughput efficiency". As can be seen, the maximum throughput efficiency is achieved when the n-bit word is broken into m-bit digits of from about four to about eight bits. For higher digit size, the efficiency decreases as a result of the slightly higher throughput, but much higher area requirements. For example, with a word size of twenty-four bits, substantially optimal digit sizes include three bits, four bits, six bits, eight bits and twelve bits. For a word size of sixteen bits, optimal digit size is either four or eight bits. With a word size of twelve bits, the optimal digit size is either four or six bits. Finally, for a word size of eight bits, an optimal digit size is approximately four bits. Thus, there exists optimality conditions which have heretofore not been appreciated in this art.

The analysis applied above to the adder circuits of FIGS. 2-4 can also be applied to all other types of digital operators. While not all operators are limited in speed by propagation of partial results along their length, such as in the case of the ripple carry in the adder circuit, the slower operators in a circuit will often limit the clock speed enough so it will typically be an operator with propagating partial results that becomes the slowest operator.

In a pipelined data flow architecture using fully parallel implementation, each successive processing step must be completed in order to generate the parallel-bit word needed for the next processing step. In a pipelined data flow architecture using digit-serial implementation on the other hand, each successive processing step often does not have to be completed beyond the generation of the initial digit of the result before the next processing step can commence. For example, such is the case in chain addition, where an augend is successively incremented (or decremented in the case of signed addition) by a number of successive addends. This capability in digit-serial architectures to start a next processing step before the current one is completed does not improve system throughput rate, but it can lead to shorter latency time for cascaded operations reducing disadvantages regarding latency times as compared to cascaded operations using fully parallel processing.

FIG. 8 shows a system wherein in accordance with an aspect of the present invention, a parallel-to-digit-serial converter 16 is used to convert an n-bit data word into a stream of m-bit digits for processing by operators optimized in accordance with another aspect of the present invention. These operators produce successive digit-serial words, each word being in the form of $(n/m)$ successive digits of m bits width. Each of these digit-serial words is converted back to a fully parallel form, which is n bits wide, a digit serial-to-parallel converter in a still further aspect of the invention. In FIG. 8 these operators are represented by a digit-serial processor 17 optimized to operate with m-bit-wide digits, which processor is followed by a digit-serial-to-parallel converter 18.

While additional overhead is incurred in converting n-bit-width parallel data into digit-serial data at the input port of a pipeline and back again at the output port, these parallel-to-digit-serial and digit-serial-to-parallel conversion devices are generally quite small and have a correspondingly small impact on the total circuit area, so they do not eliminate the advantages of choosing optimal digit size in accordance with the present invention. The invention therefore provides a significant savings in area without commensurate sacrifice in throughput. The invention provides the capability to build circuits that have nearly optimal time-area performance characteristics.

Thus, in accordance with the present invention, a designer is able to choose the digit width which provides optimal throughput required in a specific application from an extended range in which digits having more than two bits, but less than n bits, are also available to him. The designer is no longer limited to digit widths of one, two or n. (One-bit-width digits are what in effect one has in bit-serial data processing, and n-bit-width digits are in effect what one has in fully parallel data processing.)

Figure 9:
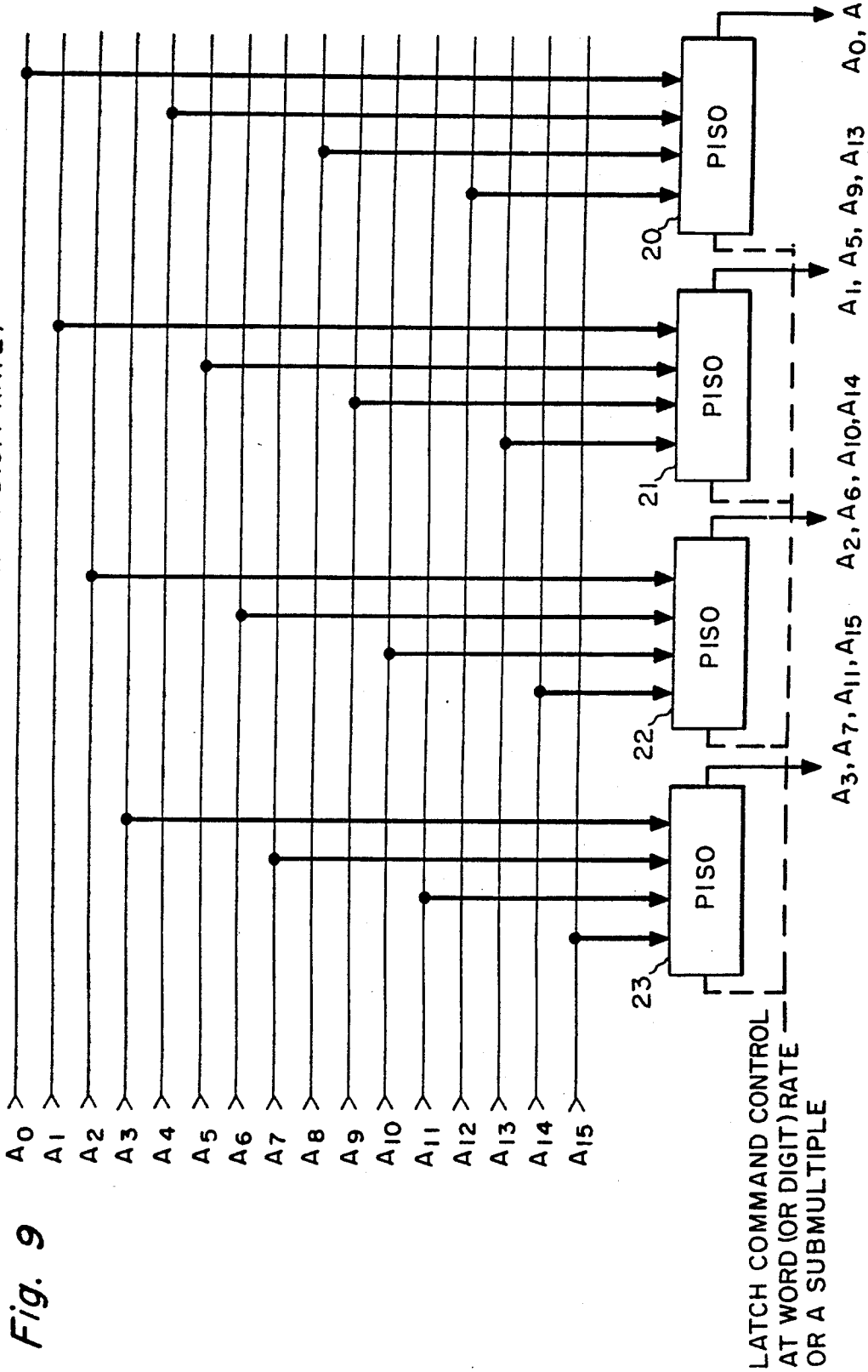
FIG. 9 is a schematic diagram of a parallel-to-digit-serial converter, which can be modified to convert a first stream of digit-serial data to a second stream of digit-serial data having a bit-width that is a submultiple of the bit-width of said first stream of digit-serial data.

FIG. 9 shows the construction of a parallel-to-digit-serial converter for converting 16-bit-wide parallel data words each into four successive 4-bit-wide digits. The FIG. 9 parallel-to-digit serial converter is of a novel type developed for use in the systems of this invention. In general, this type of parallel-to-digit serial converter may be used for converting n-bit-wide data words into $(n/m)$ successive m-bit-wide digits, where n and m are each plural integers and where m is a submultiple of n.

The sixteen bits of the parallel word supplied as input signal word to the FIG. 9 converter are in order of progressively greater significance $A_0$, $A_1$, $A_2$, $A_3$, $A_4$, $A_5$, $A_6$, $A_7$, $A_8$, $A_9$, $A_{10}$, $A_{11}$, $A_{12}$, $A_{13}$, $A_{14}$ and $A_{15}$. These bits are cyclically selected every fourth one into respective bit phases. The bits in each bit phase are used to write or load, in parallel, a respective one of the parallel-in/serial-out registers 20, 21, 22 and 23, loading being done responsive to a latch command recurrently supplied at a loading rate to all of those registers in parallel. This latch command issues once each time an entire parallel-bit word is supplied to the FIG. 9 converter.

The simultaneously written or loaded parallel-in/serial-out registers 20, 21, 22 and 23 are serially read out in parallel with each other at four times loading rate. That is, the parallel-in/serial-out registers 20, 21, 22 and 23 apportion the 16-bit words amongst themselves four bits to each register. To maintain data flow all the bits (four) received by each of the registers 20, 21, 22 and 23 each word interval must be read out serially before the register is reloaded or re-written. Assuming reloading occurs the next word interval in the FIG. 9 converter, the digit rate must be four times the word rate. In the first of these digit intervals parallel-in/serial-out registers 20, 21, 22 and 23 supply bits $A_0$, $A_1$, $A_2$, and $A_3$, respectively. Registers 20, 21, 22 and 23 supply bits $A_4$, $A_5$, $A_6$, and $A_7$, respectively, in the second digit interval, $A_8$, $A_9$, $A_{10}$ and $A_{11}$, respectively, in the third digit interval, and $A_{12}$, $A_{13}$, $A_{14}$ and $A_{15}$, respectively, in the fourth digital interval.

The FIG. 9 apparatus is of a form that is adaptable for use in converting from a first digit-serial format to a second digit-serial format, when the digits of the second format have a number of bits that is a submultiple of the number of bits in the digits of the first format in such case the latch command signal is applied to the parallel-in/serial-out registers 20–23 at digit rate for the first format, rather than at word rate. Parallel clock-out from the registers 20–23 proceeds at digit rate for the second format.

Figure 10:
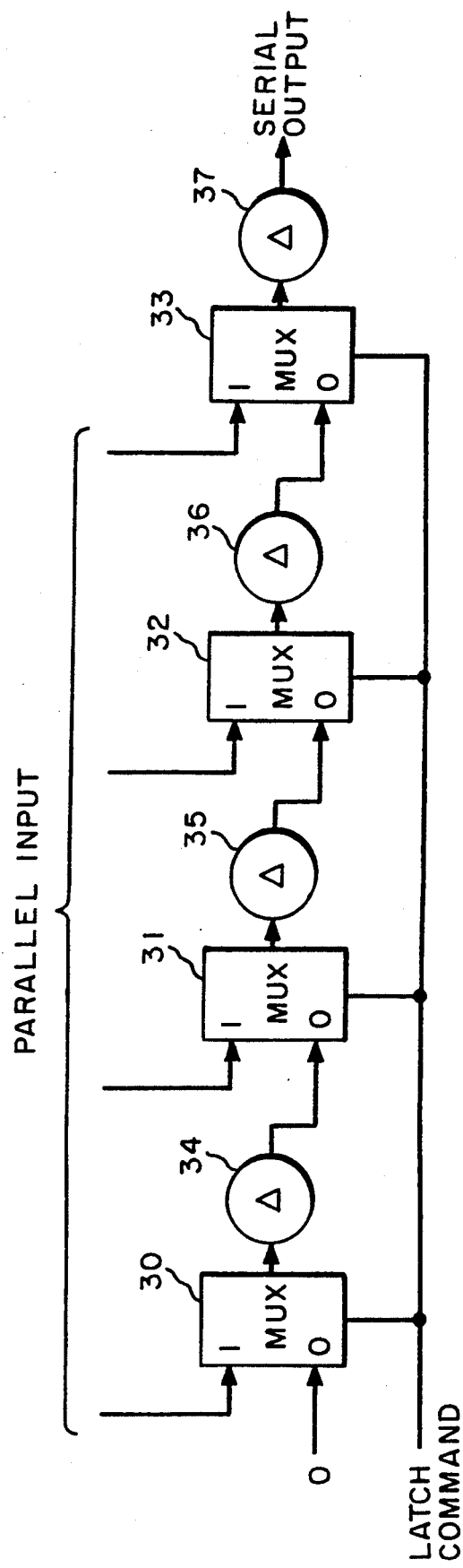
FIG. 10 is a more detailed schematic diagram of a parallel-in/serial-out register as employed in the FIG. 9 converter, which can be modified to convert a first stream of digit-serial data to a second stream of digit-serial data having a bit-width that is a submultiple of the bit-width of said first stream of digit-serial data.

FIG. 10 shows the construction of a parallel-in/serial-out register as can be used for register 20, 21, 22 or 23. When the latch command is a ZERO, multiplexers 30, 31, 32 and 33 connect delay blocks 34, 35, 36 and 37 in pipeline cascade to operate as a shift register clocking the respective contents of each delay block 34, 35 and 36 to the next and the content of delay block 37 out of the register as a serial output signal. The pipeline is refilled every fourth clock interval by latch command going high to a ONE. Multiplexers 30, 31, 32 and 33 then select respective bits of the parallel input for entry into delay blocks 34, 35, 36 and 37. Each of the delay blocks 34–37 is a data flip-flop or other clocked-bit-latch element.

FIG. 11 shows the construction of a digit-serial-to-parallel converter for converting four successive 4-bit-wide digits to 16-bit-wide parallel words. The successive least significant bits $A_0$, $A_4$, $A_8$, $A_{12}$ of four successive digits are supplied to a clocked delay line comprising delay blocks 40, 41, 42 and 43 in cascade connection. The next to least significant bits $A_1$, $A_5$, $A_9$, $A_{13}$ of those four successive digits are applied to a clocked delay line comprising delay blocks 44, 45, 46 and 47 in cascade connection. The next to most significant bits $A_2$, $A_6$, $A_{10}$, $A_{14}$ of those four successive digits, are applied to a clocked delay line comprising delay blocks 48, 49, 50 and 51 in cascade connection. The most significant bits $A_3$, $A_7$, $A_{11}$ and $A_{15}$ of those four successive digits are applied to a clocked delay line comprising delay blocks 52, 53, 54 and 55 in cascade connection. When delay blocks 40, 44, 48, 52, 41, 45, 49, 53, 42, 46, 50, 54, 43, 47, 51 and 55 have bits $A_0$, $A_1$, $A_2$, $A_3$, $A_4$, $A_5$, $A_6$, $A_7$, $A_8$, $A_9$, $A_{10}$, $A_{11}$, $A_{12}$, $A_{13}$, $A_{14}$, and $A_{15}$ respectively stored therein, these bits are latched a word latch 19 responsive to a latch command signal supplied at parallel bit word rate. Word latch 19 output signals are successive fully parallel 16-bit-wide words.

The FIG. 11 apparatus is of a form that is adaptable for use in converting to a first digit-serial format from a second digit-serial format, where the digits of the second format have a number of bits that is a submultiple of the number of bits per digit of the first format. Latch command signal is in such case applied to digit latch 19 at the digit rate for the first digit-serial format.

FIG. 12 shows a digit-serial-to-parallel converter 180 that is a modification of the FIG. 11 digit-serial processing. A set of delay elements similar to 40–55 is provided for one phase of digit-serial signal in converter 180 to bring each successive digit-serial word in that signal phase into parallel-bit alignment during the last digit of that word. During that last digit an enable command is supplied to a battery 190 of tri-state drivers in converter 180, conditioning them to apply from low-source impedance the bits $A_0$–$A_{15}$ to the sixteen input ports of the word latch 19. Word latch 19 receives a latch command at the parallel-bit-word rate, conditioning latch 19 to latch these bits as the output word from latch 19. Parallel-bit word rate is a multiple of digit-serial word rate in dual-phase or polyphase digit-serial signal processing. When battery 190 of tri-state drivers receives no enable command during other digits of the one phase of digit-serial signal, their output impedances are relatively high. One or more other digit-serial-to-parallel converters can be conditioned to supply other parallel-bit words at relatively low-source impedance during ones of these digit intervals, as converted from one or more other phases digit-serial digital signal processing, which words are latched into word latch 19 on a time-interleaved basis with parallel-bit words from digit-serial-to-parallel converter 180.

FIG. 13 shows a modification of the FIG. 8 data-processing system wherein an m-bit-digit digit-serial processor 57 having an additional input port replaces digit-serial processor 17. A fully parallel first input operand is supplied to the parallel-to-digit-serial converter 16; and a fully parallel second input operand is supplied to an additional parallel-to-digit-serial converter 56, which supplies m-bit-digit serial output to the additional input port of digit-serial processor 57.

Digit-serial processors with any number of m-bit-wide input ports can be used in the invention, with each additional input port being provided with a respective parallel-to-digit-serial converter where needed. In other variants of the FIG. 8 data processing system using a digit-serial processor with plural input ports, converter 56 may be replaced by a bit-serial-to-digit-serial converter. So may converter 16. Converter 18 may be replaced by a digit-serial-to-bit-serial converter in still further variants. Bit-serial-to-digit-serial and digit-serial-to-bit-serial converters will be described further on, in connection with FIG. 27 of the drawing.

FIG. 14 shows a simple recursive filter wherein the digit-serial processor has two input ports, one connected from its own output port to form a digital feedback loop having (n/m) digits, or one word, delay therewithin. Since the feedback signal is already in m-bit-digit digit-serial format, no converter is necessary to process it in digit-serial format. A digit-serial adder 58 receives the m-bit-wide digit-serial output from parallel-to-digit serial converter 16 at one of its augend and addend input ports, the other of its input ports receiving m-bit-wide digit-serial data from a digit-serial multiplier apparatus 59. Multiplier apparatus 59 receives a multiplier input signal from the sum output port of adder 58, which sum output port also supplies signal to the digit-serial-to-parallel converter 18 to be converted to parallel output data. Multiplier apparatus 59 uses the multiplier input signal it receives from the parallel-to-digit-serial converter 16 to multiply a negative multiplicand input signal, $-K_1$. The open-loop delay around the degenerative feedback loop connection of adder 58 and multiplier apparatus 59 is made to be one word in duration—that is, (n/m) digit intervals in duration.

This is possible inasmuch as later ones of cascaded digit-serial operations can commence before the earlier ones are completed. In FIG. 14 once the first digit of the sum result is furnished from digit-serial adder 58, multiplication can immediately begin in multiplier apparatus 59. Digit-serial multiplication may have as much delay as a full word duration associated with it. If the delay in digit-serial multiplier 59 is that long, then digit-serial adder 58 must differ from the type described in connection with FIG. 4. Adder 58 cannot include in its output connections a rank of delay blocks or clocked bit latches, as would cause the adder to exhibit a one-digit delay from either of its input ports to its output port.

The delay encountered in multiplier apparatus 59 depends on the character of the multiplicand input signal $-K_1$ which multiplier apparatus 59 multiplies by the multiplier signal from adder 58 sum output port. In most digit-serial multipliers $-K_1$ is held in parallel format within the multiplier 59, being stored in a parallel register known as a multiplicand register (or icand register, for short). If $-K_1$ as multiplicand has as many bits (exclusive of sign bits) as permitted the multiplying signal, a one-word delay is encountered in such multipliers for the minor product to be calculated and to be discarded except for carries, after which the major product is calculated. If $-K_1$ is caused to have fewer bits than a full word, the minor product can be generated in fewer digits than express a full-word. Then the major product can begin to be calculated after less than a full word's delay. Digit-serial multipliers for which the foregoing observations apply are, for example, described by P. F. Corbett and R. I. Hartley in the U.S. patent applications Ser. Nos. 134,271, and 231,937.

If $K_1$ is an integer power of two, a different type of multiplication can be used, which is carried out by cascaded steps of multiplication by $+K_1$ and multiplication by minus one. Multiplication by a $K_1$ that is an integer power of two is carried forward by bit-place shift. This is a wired bit-place shift except that, in order to selectively insert ZERO or sign-bit fill in appropriate digits, some of the wired connections include multiplexers. $K_1$ is usually less than unity, so bit place shift is to the right. Each digit shift to right and any further partial digit shift right has one digit delay associated therewith; this combined delay generally determines the total number of digits delay associated with a multiplier apparatus 59 of this type. A digit-serial data shifter of such type is described in detail by P. F. Corbett and R. I. Hartley in U.S. patent application Ser. No. 280,070 filed Dec. 5, 1988, entitled "DIGIT-SERIAL SHIFTERS CONSTRUCTED FROM BASIC CELLS" and assigned to General Electric Company. The multiplication by minus one is done by one's complementing followed by addition of unit carry. The unit carry addition can be carried out with incurring delay by introducing the unit carry into adder 58, and one's complementing is done with little delay (which little delay is outside the feedback loop if converter 16 output signal is one's complemented rather than the product output signal from multiplier apparatus 59).

The observations in the foregoing paragraph presume $K_1$ to be positive, so $-K_1$ is negative. If $K_1$ is negative, so $-K_1$ will be positive; then multiplication by $-K_1$ can be carried out simply by using bit-place shifting procedures.

FIG. 15 digital filter is an output-weighted filter that has a plurality of poles, rather than a single pole, in each of two z-transform responses therefrom; and in one of those z-transform responses it has a plurality of zeroes as well. FIG. 15 is an example of how the teachings made in connection with the FIG. 14 single-pole recursive filter find application in more complicated IIR filters. Rather than the two-input adder 58 of FIG. 14, a chain of two-input adders 580, 581 and 582 is used to permit plural digital feedback signals to be combined with the digit-serial signal obtained by conversion of the parallel input data in parallel-to-digit-serial signal converter 16 Adder 580 like adder 58 of FIG. 14 is assumed to be a type not including a digit latch in its output connections. Each of the other adders in FIG. 15 is assumed to be the FIG. 4 type of adder with a digit latch in its output connection so there is a one digit delay through the adders.

A digit-serial multiplier apparatus 591 is included in a digital feedback loop having one-word open-loop delay. This loop includes only the digit-serial adder 580 in addition to multiplier apparatus 591, to make it easier to keep delay as short as one word. Multiplier apparatus 591 multiplies its input signal with the multiplicand $-K_1$ to weight the one-word delayed signal component supplied via adder 581 to adder 580. Digit serial input signal from parallel-to-digit-serial converter 16 flows to adder 580 through adder 581, so the latency for this input signal is as small as possible consistent with including only one adder 580 in loop with multiplier 591.

The output signal from digit-serial adder 580 is applied as input signal to a tapped clocked delay line 60 comprising cascaded delay elements 601, 602, 603 and 604 having a total delay of $2(n/m)-1$ digit intervals. The initial tap of this delay line at the input port of delay element 601, the "center" tap between delay elements 602 and 603, and the final tap at the output port of delay element 604 are nominally at one-word intervals and supply samples for a finite-impulse-response (FIR) final section of the FIG. 15 filter. This final section contributes zeroes to the overall z-transform response of the FIG. 15 filter that is supplied at the output port of digit-serial-to-parallel converter 61. This final section of the FIG. 15 filter will be considered in more detail further on in this specification. The infinite-impulse-response (IIR) initial section of the FIG. 15, which initial section contributes poles to the overall bilinear-z-transform response of the FIG. 15 filter, also makes use of the tapped delay line 60 in providing a further digital feedback loop having two-word open-loop delay and in providing a still further digital feedback loop having three-word open loop delay.

The further digital feedback loop having two-word open loop delay includes the digit-serial adder 580, the delay element 601, a digit-serial multiplier apparatus 592, and the digit-serial adders 582 and 581. Digit-serial multiplier apparatus 592 multiplies its input signal with the multiplicand $-K_2$ to weight the two-word-delayed signal component supplied by the further digital feedback loop to adders 582, 581 and 580. Presuming the delay through multiplier apparatus 592 to be the same number of digit intervals as the delay through multiplier apparatus 591, the input signal to multiplier apparatus 592 is delayed respective to the input signal to multiplier apparatus 591 by one word interval less the delay through digit-serial adders 582 and 581 (which delay multiplier apparatus 592 output signal experiences, but multiplier apparatus 591 output signal does not). Presuming the delay through digit-serial adders 582 and 581 to be two digits in duration, delay element 601 provides a delay of $[(n/m)-2]$ digits, which when augmented by one digit delays in each of the adders 582 and 581 causes the $-K_2$—weighted responses of multiplier apparatus 592 to be delivered to adder 581 with one word's delay respective to the $-K_1$—weighted response of multiplier apparatus 592.

The still further digital feedback loop having three-word open-loop delay includes the digit-serial adder 580, delay elements 601, 602 and 603, a digit-serial multiplier apparatus 593, and the digit-serial adders 582 and 581. Delay elements 602 and 603 together provide an additional word's length delay to the input signal supplied to multiplier apparatus 593 as compared to the input signal supplied to multiplier apparatus 597. Digit-serial multiplier apparatus 593 multiplies its input signal with the multiplicand $-K_3$ to weight the three-worddelayed signal component supplied by the still further digital feedback loop to adder 582.

The three digital feedback loops together generate a z-transform response to the digit-serial input signal supplied to its augend input port from parallel-to-digit-serial converter 16, which response appears at the sum output port of adder 580 and has a system function of $(1+K_1z^{-1}+K_2z^{-2}+K_3z^{-3})^{-1}$. This is the response of the initial infinite-impulse-response (IIR) portion of the FIG. 15 filter. If a response of the FIG. 15 filter network is to have no zeroes in addition to the three poles, this initial IIR portion of FIG. 15 filter suffices to provide that response, which can be taken directly from the sum output port of adder 580 to the input port of digit-serial-to-parallel converter 18 for conversion to n-bit-wide parallel output data.

A digit-serial-to-parallel converter 61 converts to parallel output data a digit-serial response that has zeroes incorporated therein to provide a $(L_0+L_1z^{-1}+L_2z^{-2})/(1+K_1{}^{-1}z+K_2z^{-2}+K_3z^{-3})$ system function. The zeros in the numerator of the system function arise from a final finite-impulse-response (FIR) section of the FIG. 15 filter, which shares tapped clocked delay line 60 with the previously described initial IIR section of the FIG. 15 filter. In essence, tap signals from clocked delay line 60 that are nominally a word interval apart are weighted and summed in the final FIR section of the FIG. 15 filter to supply digit-serial input signal to digit-serial-to-parallel converter 61. Allowance is made in selecting actual tap locations in clocked delay line 60 for differential delay in the weighting and summing of the tap signals taken from those locations. To secure minimum latency through the final FIR section of the FIG. 15 filter and to minimize the number of digits of total delay required of clocked delay line 60, the signal from digit-serial adder 580 to the input tap of clocked delay line 60, as weighted by a factor $L_0$ in digit-serial multiplier 621, is applied without delay to the augend input port of the final digit-serial adder 631 in this weighting and summing. This final digit-serial adder 631 supplies its sum output signal to the input port of digit-serial-to-parallel converter 61.

Adder 631 receives as an addend input signal the sum output signal of a digit-serial adder 632. Adder 632 receives an augend input signal from the product output port of a digit-serial multiplier apparatus 622 and receives an addend input signal from the product output port of a digit-serial multiplier apparatus 623. Delay elements 603 and 604 together delay the multiplier input signal to multiplier apparatus 623 by one digit-serial word duration respective to the multiplier input signal to multiplier apparatus 622, and multipliers 622 and 623 multiply their respective multiplier input signals by weighting factors $L_1$ and $L_2$, respectively. The multiplier input signal to multiplier apparatus 622 is delayed by delay elements 601 and 602 only $[(n/m)-1]$ digits respective to the multiplier input signal to multiplier apparatus 621, the additional digit delay afforded by adder 632 bringing the sum of the product output signals of multiplier apparatuses 622 and 623 into word alignment with the product output signal of multiplier apparatus 621 at the input ports of adder 631.

One skilled in the art of digital filter design will be enabled by the foregoing description of FIG. 15 to construct digital filters of the same general type having other than three poles and three zeros in their system functions. The clocked delay line 60 is designed to provide the requisite number of taps, so that a respective digital feedback path to adder 580 with an open-loop delay that is a multiple of digit-serial word duration can be provided for each pole in the system function of the filter, and so that a respective digital forward path of specified duration is provided from the input of the digit-serial portion of the filter to its final adder 631 can be provided for every zero in the system function of the filter. Cleverness in the utilization of adder delays can allow for the elimination of some delay in clocked delay line 60, so it can be somewhat shorter than a multiple of digit-serial word interval. While cascade or chain addition arrangements 582, 581, 580 and 632, 631 are shown in FIG. 15, tree addition arrangements may be used instead.

One skilled in the art of digital filter design will notice general similarities of the FIG. 15 output-weighted digital filter and the canonic output-weighted digital filter for fully parallel implementation. (A canonic form filter is that form which uses the minimum number of unit clock delays in its construction; and all other less-efficient-of-delay filter structures can be developed by cascade or parallel connections, or combinations of such connections, of component canonic filters). A difference from prior-art filtering is that cascaded operations telescope into each other in digit-serial processing, later operations beginning before earlier operations are completed. Another important difference is that generally the clocked delay line 60 does not have its taps separated by unit clock delays. Rather the taps would be separated by unit digit-serial word delays if one did not have to adjust tap locations to compensate for differential delays that the adders introduce into the weight-and-sum procedures in the IIR initial section and the FIR final section of the FIG. 15 filter. That is, each unit-word delay of one clock cycle in fully parallel data processing is in digit-serial processing discarded in favor of (n/m) clock cycles of delay, which is the unit word delay in digit-serial data processing.

While there tend to be more cycles of clock delay between taps in the clocked delay lines of digit-serial filters than of parallel-data-filters, each delay element processes data that spans only the m bits width of a digit, rather than the n bits width of a word. So digital hardware requirements in a digit-serial clocked delay line supporting a prescribed filter system function are not appreciably greater than for a parallel-data clocked delay line for supporting the same filter system function, except to the extent that one-word delay elements in the delay line may be more easily subsumed in the delays of associated processing circuits. At suitable places in digit-serial circuitry a designer often must introduce delays that are multiples of digit interval, but not of word interval, to assure that there is proper alignment of data words in processing (such as signal addition) that involve a plurality of digit-serial input signals. This need is often evidenced in digit-serial filter design, as demonstrated in the foregoing description of the FIG. 15 digital filter.

FIG. 16 is an input-weighted filter that has a plurality of poles in the response from its digital-serial-to-parallel converter 18 and has a plurality of zeros as well as a plurality of poles in the response from its digit-serial-to-parallel converter 61. In contrast to the output-weighted FIG. 15 filter, the input weighted FIG. 16 filter has no tapped delay line 60 that is shared by both the IIR initial section and the FIR final section of the filter. This comes about because a delay element 641 (corresponding to delay element 601 of the FIG. 15 filter) and a delay element 642 (corresponding to the cascaded delay elements 602 and 603 of FIG. 15) are moved within the digital feedback loops from positions before the multipliers 592 and 593 in the initial IIR portion of the FIG. 15 filter to positions after those multipliers in the initial IIR portion of the FIG. 16 filter.

The final FIR portion of the FIG. 16 has a separate delay structure comprising an (n/m)-digit delay element 654, a digit-serial adder 634, an [(n/m)−1]-digit delay element 653, a digit-serial adder 633, an [(n/m)−1]-digit delay element 652, the digit-serial adder 632, an [(n/m)−1]-digit delay element 651 and the digit-serial adder 631. If the elements 654, 634, 653, 633 and 652 were dispensed with and if an (n/m)-digit delay element connected digit serial multiplier 623 output port to the addend input port of digit-serial adder 632, inverter 61 would provide the same $(L_0+L_1z^{-1}+L_2z^{-2}L_3z^{-3})/(1+K_1z^{-1}+K_2z^{-2}+K_3z^{-3})$ system function response to a unit impulse as in the FIG. 15 filter. The FIG. 16 filter as thus modified would require somewhat more digital hardware than the output-weighted FIG. 15 filter because the initial and first sections of the FIG. 16 filter do not share the same delay structure. The hardware advantage of input weighting is felt when the final FIR section is linear-phase, and so has a symmetric kernel as shown in FIG. 16, or when the filter for some other reason employs a kernel having equal weights at different ones of its data word positions. In FIG. 16 digit-serial multiplier 623 weights both the earliest and the latest data words being convolved with the filter kernel and digit-serial multiplier 622 weight both the next-to-earliest and next-to-latest data words. Converter 61 provides a $(L_0+L_1z^{-1}+L_2z^{-2}+L_1z^{-3}+L_0z^{-4})/(1+K_1z^{-1}+K_2z^{-2}+K_3z^{-3})$ system function response to a unit impulse.

One skilled in the art of digital filter design will note general similarities of the FIG. 16 input-weighted digital filter modified as described in the second sentence of the foregoing paragraph and the canonic input-weighted digital filter for fully parallel implementation. The differences between the digit-serial and parallel input-weighted digital filters are much the same as discussed previously with regard to output-weighted filters. The FIG. 15 and 16 filters and extensions of them to include different numbers of taps in the filter kernels are canonic forms of output-weighted and input-weighted digit-serial filters, then, and the techniques of modifying the canonic filters for fully parallel implementation to non-canonic forms can be adapted to these canonic filters for digit serial implementation. Consider some examples of such modifications.

In FIG. 15 elements 621, 622, 623, 631, 632 and 61 can be dispensed with to obtain a three-pole, no-zero infinite impulse response at converter 18 output port. In FIG. 15 elements 580–582, 591–593 and 18 can be dispensed with, and also the output port of parallel-to-digit-serial converter 16 can be directly connected to the input tap of clocked delay line 60, thereby to provide a no-pole, three-zero finite impulse response at the output port of digit-serial-to-parallel converter 61. In FIG. 16 elements 621–623, 631–634, 651–654 and 61 can be dispensed with to obtain a three-pole, no-zero infinite impulse response at converter 18 output port. In FIG. 16 elements 580–582, 591–593, 641, 642 and 18 can be dispensed with, and also the output port of converter 16 can be connected directly to supply the input ports of digit-serial multipliers 621–623, thereby to provide a no-pole, five-zero finite impulse response at the output port of converter 61. Digit-serial filters of the canonic types of FIG. 15 and 16 but with differing numbers of poles or of zeroes or of both poles and zeroes may be similarly modified. Selected ones of these modified filters may then be cascaded or paralleled to generate a wide variety of non-canonic filters.

The present invention also permits one to take advantage of the greater throughput efficiency achieved at digit sizes less than the full word size by dividing calculations into separate independent streams or, more interestingly, into interacting streams. For example, if the word size is sixteen bits and a required throughput is one word per clock cycle, then it would normally seem that the necessary digit size is sixteen bits, since conventional wisdom indicates that the throughput is equal to one sample every (word-size/digit-size) clock cycles. However, as shown in the throughput efficiency graphs of FIG. 7, a word size of sixteen bits is not very efficient. An alternative solution to this problem is to use a new type of plural-phase processing, or simultaneous processing, wherein a conversion to digit-serial processing is carried out in connection with dividing the calculation into a plurality of streams and the calculation (presumed to be separable in nature) is carried out separately on each digit-serial stream.

FIG. 17 shows how processing of first and second operands, each fully parallel in nature, can be carried forward on a dual-phase, or two-parallel-stream, basis after parallel-to-digit-serial conversion. Each of the first and second operands is separated into two sets of alternate words for separate processing on a separable basis, an even set of words occurring during a phase zero and an interleaving-in-time set of words occurring during a phase one. To implement this, a phase zero latch command is applied during even-numbered words to parallel-to-digit serial converters 71 and 72 (each of which can be constructed in accordance with FIGS. 9 and 10) to condition them to convert successive ones of the n-bit-wide even words of the first and second operands each to m-bit-wide digit-serial form thence to be supplied to the digit-serial processor 70. The digit-serial output signal from processor 70 is converted to an even-numbered set of n-bit-wide parallel output data words by a digit-serial-to-parallel converter 73, to be supplied to a word latch 79.

The odd-numbered words of the first and second operands are processed together in another optimized m-bit-digit digit-serial processor 75. To implement this, a phase one latch command is applied during odd-numbered words to parallel-to-digit serial converters 76 and 77 (each of which can be constructed in accordance with FIGS. 9 and 10) to condition them to convert successive ones of the n-bit-wide odd-numbered words of the first and second operands to m-bit-wide digit-serial form to be supplied to the digit-serial processor 75. The digit-serial output signal from processor 75 is converted to an odd-numbered set of n-bit-wide output data words by a digit-serial-to-parallel converter 78, to be supplied to the word latch 79.

Digit-serial-to-parallel converters 73 and 78 each are constructed in accordance with FIG. 12, and their respective enable commands are each supplied every other parallel input data word, and alternate with each other. That is, one receives a phase zero enable command and the other, a phase one enable command. Which receives which depends on the latency time of processors 70 and 75. The output signals of digit-serial-to-parallel converters 73 and 78 interleave at parallel input data word rate to generate parallel-format output data, which are latched by word latch 79 to appear on a single output bus. These parallel output data are generated in the FIG. 17 system by two digit-serial processors 70 and 75 operating on two respective phases of data, but polyphase operation using a multiplicity of processors operating on different phases of data is possible as well and should be considered when trying to settle on the most favorable design for a system.

FIG. 18 illustrates how processing of a plurality of operands, each fully parallel in nature, can be carried forward on a polyphase basis after parallel-to-digit-serial conversion. The words of each operand are divided into four sets of time-interleaved phases. These successive phases (which repeat on a cyclic basis) are phase zero, phase one, phase two and phase three. Parallel-to-digit-serial converters 80, 81, 82 and 83 (each of which may be constructed in accordance with FIGS. 10 and 11) receive respective latch commands during these successive phases to operate as a polyphase parallel-to-digit-serial converter for converting the parallel-format first input operand into four-phase m-bit-wide digit-serial input data. The four phases of this digit-serial input data are applied to optimized m-bit-digit digit-serial processors 84, 85, 86 and 87. A parallel-format second input operand may be converted by a further polyphase parallel-to-serial-converter 88, as shown, to generate further four-phase m-bit-wide digit-serial input data, the four phases of which are also applied to digit-serial processors 84, 85, 86 and 87 respectively. A parallel-format third input operand may be converted by a still further polyphase parallel-to-digit-serial converter 89, as shown, to generate still further four-phase m-bit-wide digit-serial input data, the four phases of which are applied to processors 84, 85, 86 and 87, respectively.

The digit-serial output data from processors 84, 85, 86 and 87 are supplied to digit-serial-to-parallel converters 90, 91, 92 and 93, respectively, which cooperate to provide polyphase digit-serial-to-parallel conversion. To implement the polyphase conversion, converters 90, 91, 92 and 93, each assumed to be constructed per FIG. 12, receive their respective enable commands in successive ones of phase zero, phase one, phase two and phase three of the parallel input data. Which ones depends on the latency through processors 84, 85, 86 and 87. A word latch 94 latches the successively generated phases of parallel output data on its input bus, to supply parallel-bit data at its output port.

As an example of the trade-off between speed and chip size that can be made in accordance with the invention, an example of a 16-bit four-tap finite impulse response (FIR) filter is considered. Input and output to the designed chip is in parallel format, with parallel-to-serial conversion being done on the chip. The coefficients of the filter are loadable from off the chip through a parallel data bus. For simplicity, the data input bus is used to carry the coefficient data. In addition, there is a two-bit-wide address bus to address the four coefficient registers and a write signal is provided to indicate that a coefficient is to be loaded. Loading a coefficient register is asynchronous and similar to a RAM (random access memory) write operation. The following table illustrates the results from compiling the chip using different digit sizes:

TABLE I

| Digit Size | Area (sq.mils.) | Time per Word (ns) | Word Rate (MHz) | 1/AT |
|---|---|---|---|---|
| 1 | 16,286 | 22.5 × 16 | 2.7 | 170.6 |
| 2 | 16,788 | 25.0 × 8 | 5.0 | 297.8 |
| 4 | 19,720 | 30.0 × 4 | 8.3 | 422.6 |
| 8 | 26,972 | 40.0 × 2 | 12.5 | 463.5 |
| 16 | 42,430 | 60.0 × 1 | 16.7 | 392.8 |
| 2 × 8 | 47,391 | 40.0 × 1 | 25.0 | 527.5 |
| 4 × 4 | 59,843 | 30.0 × 1 | 33.3 | 557.0 |

The areas shown in the table are actual areas of compiled chips (including interconnection pads). The speed rates shown are estimates. The data from the last two lines of the table are explained further below.

Note that the efficiency (1/AT) peaks for an eight-bit digit size and then decreases for the 16-bit digit size. It is noted that the units of efficiency indicated here are words per square mil per second. This decrease occurs in spite of the fact that for the 16-bit or fully parallel version of the chip the parallel-to-serial converters were not included, these being unnecessary. In fact, for high word size, it is seen that the situation of diminishing returns results where chip area increases substantially, but throughput does not.

On the other hand, note the great improvement of a two-bit digit size over bit-serial operations (digit size=1). The size of the chip is increased in this instance by only 3%, but the throughput almost doubles. This is a fair comparison with bit-serial designs.

With a digit size of sixteen, it is noted from Table I above, that efficiency decreases. Using digit-serial computation, it is possible, however, to increase the speed of the design by splitting the computation into parallel data streams. In order to maintain a throughput of one word per clock cycle, but to maintain a high clock rate, the input stream of sixteen parallel bits is split into two 8-bit-wide streams, whereby the even-numbered words are assigned to one stream and the odd-numbered words are assigned to the other stream. Two concurrent computations are now carried out at the same time and the results merged at the output. This alternative arrangement (often referred to as "dual-phase" operation) is also described above, but Table I, the next-to-last line of which refers to this design, provides a more concrete illustration of its advantages. Since computations are made on 8-bit wide data, a high clock rate may be maintained. As can be seen, this design produces a 25 megahertz FIR filter.

Using four parallel streams which are each four bits wide, a throughput of 33.3 megahertz is achieved. The last line of Table I refers to this design and shows that this achieves an even higher efficiency. Since designs with more than four streams are probably not feasible for reasonably sized chips and a word size of sixteen bits, the designs represented by the last two lines of Table I appear to provide at the present state of the art the best throughput efficiency for 16-bit words achievable using the invention.

Thus, greater speed and efficiency are achieved in digital signal processing designs by using digit-serial rather than word-parallel computation. The highest sample rates for words are achieved by splitting the computation into parallel computational streams in order to use a digit-size in the four-to eight-bit range. Note that choice of digit size is critical in determining optimality, as measured by throughput efficiency. Throughput efficiency has been an insufficiently appreciated parameter and furthermore, it is a parameter which has not been discerned as being subject to optimizable control, particularly as a function of digit size.

FIG. 19 shows the essentials of a three-zero FIR filter for n-bit-wide-data which does data processing in dual-phase digit-serial format to generate $(L_0+L_1z^{-1}+L_2z^{-2}+L_3z^{-3})$ system response, as expressed in z transform. Parallel-to-digit-serial converters 71 and 76 receiving latch commands during phase zero and phase one respectively split the n-bit-wide parallel input data into two (n/2)-bit-wide digit-serial data streams clocked at a digital clock rate that is the same as the parallel input data word rate. There are two digits per word in the digit-serial data streams from converters 71 and 76. Delay element 981 delays the digit-serial output signal of converter 71 to bring it into word alignment with the digit-serial output signal of converter 76.

When the first digit of a word is clocked out of converter 76, this word may be considered the current word, and the word being clocked out of delay 981 element at the same time may be considered as being one word back. One clocked delay line receptive of the current word at its input tap includes an initial two-clock-cycle (one-word) delay element 991 and a final two-clock cycle (one-word) delay element 992 in cascade connection, which delay elements 991 and 992 have words two back and four back latched at their respective output ports. Another clocked delay line includes in cascade connection after delay element 981 a two-clock-cycle (one word) delay element 993 having a word three back latched at its output port. The current word, the word one back, the word two back, and the word three back are weighted by respective multiplicands $L_0$, $L_1$, $L_2$ and $L_3$ in digit-serial multiplier apparatuses 750, 751, 752 and 753, respectively; and the resulting products are summed by a tree of digit-serial adders 754, 755 and 756 to generate a phase one of filter response. The words one back, two back, three back and four back are weighted by respective multiplicands $L_0$, $L_1$, $L_2$ and $L_3$ in digit-serial multiplier apparatuses 700, 701, 702 and 703, respectively; and the resulting products are summed by a tree of digit-serial adders 704, 705 and 706 to generate a phase zero of filter response. A delay element 982 delays the phase one of filter response from adder 756 one digit interval for application to a digit-serial-to-parallel converter 78, and the phase zero filter response from adder 706 is applied without further delay to a digit-serial-to-parallel converter 73. Delay element 982 staggers the phasing of digit-serial words supplied to digit-serial-to-parallel converters 73 and 78 to facilitate their enable commands being applied on an alternating basis. Converters 73 and 78 receive their respective enable commands during phases zero and one, to place in time-interleaving the two phases of parallel output words they respectively generate on a single n-bit-wide bus. Word latch 79 latches these parallel output words to provide FIG. 19 filter response on an n-bit-wide output bus.

FIG. 20 shows a dual-phase three-zero FIR filter that is a modification of the FIG. 19 filter, in which modification the number of digits of delay is reduced. The two-clock-cycle delay element 993 is replaced by two single-clock-cycle delay elements 983 and 984 in cascade, so phase one filtering up to the output port of adder 756 is essentially unchanged from FIG. 19 filter. Phase zero filtering in the FIG. 21 filter is done one digit (or half-word) earlier than in the FIG. 19 filter. To this end digit-serial multiplier apparatuses 700 and 702 take their multiplier input signals one digit earlier in the three-digit-long tapped clocked delay line from converter 71 in FIG. 20 than they took from the three-digit-long tapped clocked delay line from converter 71 in FIG. 19. The four-digit-long tapped clocked delay line from converter 76 in FIG. 19 is replaced in FIG. 20 by a differently tapped three-digit-long clocked delay line comprising delay elements 985, 986 and 987; and digit-serial multiplier apparatuses 701 and 703 take their multiplier signals one digit earlier in this three-digit-long delay line than they did from the four-digit-long delay line of FIG. 19. Since the phase zero filtering is done one digit or half word earlier, the filter result at adder 706 output port leads the filter result at adder 756 output port, so delay element 982 can be dispensed with.

Performing the plural-phase filtering in time-interleaved phases, rather than in non-time-interleaved ones, saves delay elements no matter how many phases are employed in filtering. Furthermore, the number of delay elements required for different digit-size processing tends to be constant with changes in digit-size when these minimum delay networks are used. So there is less digital hardware increase with going to fewer bits per digit if plural-phase filtering is done on a time-interleaved basis rather than on a non-time-interleaved basis.

FIG. 21 shows a modification of the FIG. 20 three-zero FIR filter that can be employed when the filter system function is linear-phase, taking the form $L_0+L_1z^{-1}+L_1z^{-2}+L_0z^{-3}$. When $L_0$ and $L_3$ are equal, a single digit-serial multiplier 110 receiving multiplicand signal from a digit-serial adder 990 replaces digit-serial multipliers 700 and 703, and a single digit-serial multiplier 100 receiving multiplier signal from a digit-serial adder 991 replaces multipliers 750 and 753. When $L_1$ and $L_2$ are equal, a single digit-serial multiplier apparatus 101 receiving multiplier signal from a digit-serial adder 992 replaces digit-serial multiplier apparatuses 701 and 702, and a single digit-serial multiplier apparatus 111 receiving multiplier signal from a digit-serial adder 993 replaces digit-serial multiplier apparatuses 751 and 752. This halves the amount of digit-serial multiplication, at a substantial saving in chip area on an integrated circuit; and digit-serial adders 990-993 take up no more die area than the replaced digit-serial adders 704, 705, 754 and 755.

FIG. 22 shows a linear-phase four-zero filter using dual-phase digit-serial processing, which filter has a system function of the form $L_0+L_1z^{-1}+L_2z^{-2}+L_1z^{-3}+L_0z^{-4}$ as expressed in z transform. Parallel-to-digit-serial converter 71 supplies the input tap of one five-tap clocked delay line comprising the cascaded unit-clock-delay elements 121-124, and parallel-to-digit-serial converter 76 supplies the input tap of another five-tap clocked delay line comprising the cascaded unit-clock-delay elements 126-129.

Consider now how the phase zero filter response component is generated. The tap signals at the initial and final taps of the delay line supplied by converter 71 are added together in a digit-serial adder 130, and their sum is supplied as multiplier signal to a digit-serial multiplier apparatus 131, to be weighted by multiplicand $L_0$. The tap signals at the second and penultimate taps of the delay line supplied from converter 76 are added together in a digit-serial adder 132 and supplied as multiplier signal to a digit-serial multiplier apparatus 133 to be weighted by multiplicand $L_1$. A digit-serial adder 134 combines the sum output signals from digit-serial adders 131 and 133 to provide a weighted summation of four of the five data words from which the phase zero filter response is to be generated. The intermediate one of the five data words to be weighted and summed to generate the phase zero filter result could be taken from the tap between delay elements 122 and 123, if that data word after weighting by multiplicand $L_2$ were delayed by two digit intervals to be then summed in appropriate timing with adder 134. Rather than doing this, there is no need for additional delay elements to provide two digit intervals of delay if one delays the multiplier signal by two digit intervals before multiplication, obtaining those two digit intervals from a later tap in the delay line with input tap connected to converter 71. Accordingly, a digit-serial multiplier apparatus 135 takes its multiplier signal two digit intervals later, from the output port of delay element 124 and multiplies it with the multiplicand $L_2$ to generate a product that is supplied to a digit-serial adder 136. Adder 136 supplies the phase zero filter result from its own output port in digit-serial format to the digit-serial-to-parallel converter 73.

Consider now how the phase one filter response component is generated. It is done analogously to the generation of the phase zero filter response component, elements 140–146 operating in substantially the same way as elements 130–136 respectively.

The FIG. 22 filter illustrates that any differential delay in the summation portions of the weighting and summing procedures for digital filtering must be compensated for and further illustrates that this compensation may be economically provided for by selecting signals for weighting and summing from appropriate taps in the clocked delay lines associated each to a respective filter phase. A three-zero filter or any other ($2^i-1$) zero filter, where i is any positive integer, is a special case in that an adder tree can add the weighted data words without differential delay. Otherwise differential delay must be taken into account, and regularity of filter geometry may be promoted by chain-addition rather than tree-addition schemes to make layout with a silicon compiler easier.

FIG. 23 shows an input-weighted three-zero FIR filter that is the equivalent of the FIG. 20 output-weighted three-zero FIR filter, where chain addition provides the clocked delay line for storing weighted digit-serial words to properly delay them differentially, as well as summing the weighted digit-serial words. The input-weighted/dual-phase digital filter section 2 is of particular interest in FIG. 23, the conversion circuitry being similar to that of FIG. 20. Digit-serial multipliers 700–703 receive their multiplier signals in parallel, eliminating the input delay line comprising single-clock-delay elements 981–984; and it is the products from multipliers 700–703 that are differentially delayed respective to each other and added to generate input signal for digit-serial-to-parallel converter 73, this being done using a single-clock delay element 705 and the successive single-clock delays afforded by chain addition through adders 707–709. Digit-serial multipliers 750–753 receive their multiplier signals in parallel, eliminating the input delay line comprising single-clock-delay elements 985–987; and it is the products from multipliers 700–703 that are differentially delayed respective to each other and added to generate input signal for digit-serial-to-parallel converter 78, this being done using a single-clock-delay element 755 and the successive single-clock delays afforded by chain addition through adders 757–759. Using the chain adders 707–709 and 757–759 to generate differential delay provides a substantial savings in filter hardware.

FIG. 24 shows an input-weighted linear-phase digit-serial filter having the same finite impulse response $L_0+L_1z^{-1}+L_1z^{-2}+L_0z^{-3}$ as the output-weighted linear-phase digit-serial filter of FIG. 21. The dual-phase digit-serial section 3 of the FIG. 24 filter has four fewer single-clock-delay elements than the FIG. 21 filter.

FIG. 25 shows an input-weighted linear-phase digit-serial filter having the same finite impulse response $L_0+L_1z^{-1}+L_2z^{-2}+L_1z^{-3}+L_0z^{-4}$ as the output weighted linear-phase digit-serial filter of FIG. 22. The dual-phase digit-serial filter section 4 of the FIG. 25 filter has six fewer single-clock-delay elements than the FIG. 22 filter. As compared to the FIG. 22 and 24 filters, the FIG. 25 filter has adders 706 and 756 added to accommodate the further zero in the filter impulse response.

FIG. 26 shows an input-weighted three-zero FIR filter that doubly splits the input signal data stream to provide four phases of polyphase operation, which filter can be compared to the FIG. 23 dual-phase filter to obtain an insight into the comparisons made between two-phase and four-phase filtering that were described earlier in this specification.

Parallel-to-digit-serial converters 80, 81, 82 and 83 operate in FIG. 26 as a polyphase parallel-to-digit-serial converter to supply four phases of input data in respective digit-serial data streams, after the manner described in FIG. 18. However, in the FIG. 26 filter the subsequent data processing is done with there being interaction between the data streams, rather than the data streams being processed separately as in FIG. 18. The samples from converter 80 are weighted by $L_0$, $L_1$, $L_2$ and $L_3$ using multipliers 840, 841, 842 and 843 respectively. The samples from converter 81 are weighted by $L_0$, $L_1$, $L_2$ and $L_3$ using multipliers 850, 851, 852 and 853 respectively. The samples from converters 82 are weighted by $L_0$, $L_1$, $L_2$ and $L_3$ using multipliers 860, 861, 862 and 863 respectively. And the samples from converter 83 are weighted by $L_0$, $L_1$, $L_2$ and $L_3$ using multipliers 870, 871, 872 and 873 respectively.

The weighted samples are then differentially delayed and combined to generate four phases of digit-serial filter response that are respectively supplied to digit-serial-to-parallel converters 90–93 in a polyphase digit-serial-to-parallel converter, which is similar to that of FIG. 18, and includes component converters 90–93 and word latch 94. Digit-serial input signal for converter 90 is supplied from the tapped delay line formed by delay element 845 and cascaded adders 847–849, which add the current phase zero input signal as weighted by $L_0$, the phase one input signal as weighted by $L_1$ input signal as weighted by $L_2$ and delayed by one word, the phase two and delayed by two words and the phase three input signal as weighted by $L_3$ and delayed by three words. Digit-serial signal for converter 91 is supplied from the tapped delay line formed by delay element 855 and cascaded adders 857–859, which add the current phase one input signal as weighted by $L_0$, the phase two input signal as weighted by $L_1$ and delayed by one word, the phase three input signal as weighted by $L_2$ and delayed by two words, and the phase zero input signal as weighted by $L_3$ and delayed by three words. Digit-serial input signal for converter 92 is supplied from the tapped delay line formed by delay element 865 and cascaded adders 867–869 which add the current phase two input signal as weighted by $L_0$, the phase three input signal as weighted by $L_1$ and delayed by one word, the phase zero input signal as weighted by $L_2$ and delayed by two words, and the phase one input signal as weighted by $L_3$ and delayed by three words. Digit-serial input signal for converter 93 is supplied from the tapped delay line formed by delay element 875 and cascaded adders 877–879, which add the current phase three input signal as weighted by $L_0$, the phase zero input signal as weighted by $L_1$ and delayed by one word, the phase one input signal as weighted by $L_2$ and delayed by two words, and the phase two input signal as weighted by $L_3$ and delayed by three words.

In comparing the FIG. 23 two-phase filter and the FIG. 26 four-phase filter, one notes that while each element in the former has a pair of corresponding elements in the latter, the bit-width of elements in the FIG. 26 four-phase filter is only one half the bit-width of elements in the FIG. 23 two-phase filter. The four-phase filter has an area disadvantage primarily because the number of interconnections that must be made between elements and the need for more connections for control signals. In integrated circuits with plural-level connections this area disadvantage tends to be a modest one. Accordingly, the higher speed of the four-phase processing tends to make it throughput to area ratio more favorable than that of two-phase processing.

FIG. 20 shows a canonic form for a two-phase output-weighted FIR filter. FIG. 23 shows a canonic form for a two-phase input-weighted FIR filter. FIG. 26 shows a canonic form for a four-phase input weighted FIR filter. Their principles can be extended by design procedures obvious to one skilled in the art of digital filter design to develop canonic FIR forms for other plural-phase digital filters having different numbers of zeros and having different number of phases of operation. The design principles can also be extended to digital filters where weighting is done within the delay structures, rather than before or after the delay structures.

A significant difference of the plural-phase digit-serial filters shown in FIGS. 19-26 over the parallel-bit-word plural-phase filters of the prior art is that there are interconnections between the different processing phases. That is, the delay structures of the digit-serial filters are not restricted to being tapped at multiples of word delay, but rather can be tapped at multiples of the following quotient Q: word delay divided by the number of word phases used in the filtering. Where the number of digits per word is the number of word phases used in the plural-phase filter, or is a multiple thereof, it is particularly easy to tap the delay structure at multiples of Q. Tapping the delay structures at appropriate multiples of Q facilitates there being word alignments between different ones of the parallel delay structures, which allows samples from more than one of the parallel delay structures to be combined in a filter response. Conventionally, in polyphase filtering the words of each phase are filtered independently of each other, so filtering is done on a subsampling basis. That is, the filter kernel for each of the p independent paths through the filter network has non-zero values for only one subsampling phase and has zero values for each other subsampling phase, as considered from the standpoint of the input signal to and output signal from the filter network. In the filters of FIGS. 19-26, where samples from more than one subsampling phase are combined to generate a filter response, filtering proceeds on a fully sampled basis, with the filter kernels determining each phase of filter response being similar and having non-zero values in more than one phase of subsampling. The polyphase parallel-to-digit-serial conversion and polyphase digit-serial-to-parallel conversion becomes means to the end of providing for banked filtering of the parallel-bit-word input signal of each of the filters in FIGS. 19-26. Interestingly, this technique for banked filtering works even when digit size is reduced to one bit, with the parallel-to-digit-serial converters replaced by parallel-to-serial converters, and with the digit-serial-to-parallel converters replaced by serial-to-parallel converters.

FIG. 27 shows how bit-serial input data can be converted to digit-serial format for processing by an optimized m-bit-digit-serial processor 6 and how the processor 6 digit-serial output signal can thereafter be converted to a bit-serial output signal. A bit-serial-to-digit-serial converter, such as 8, is receptive of the bit-serial input data received on a one-bit-wide input signal bus, which bit-serial data comprises successive words that can be considered as being two's complement numbers, each word comprising n bits supplied in order of increasing significance with the sign bit last. These serially supplied bits are considered to be supplied in cycles of m bits where m is a submultiple of n, the number of bits per data word; and the m bit phases of these cycles are separated into m parallel bit streams and then adjusted in timing to synchronize bit flows in the m bit streams, these procedures constituting the bulk of the bit-serial-to-digit-serial conversion. The remainder of the conversion consists of responding to a signal flagging the occurrence of the most significant bit of each bit-serial word to generate a signal flagging the occurrence of the most significant digit of the digit-serial data generated by the conversion.

FIG. 27 presumes the number n of bits per bit-serial word to be a multiple of four—e.g. sixteen—and the number in the bits per digit to be four in the digit-serial data. Accordingly, the bit cycle is four bits in length. Unit-clock-delay elements 801, 802 and 803 are connected as a delay line having four taps (including input and output taps) at which the current bit and three immediately previous bits of the bit-serial signal are continuously furnished. These four successive bits are furnished in parallel to the m-bit-wide input port of a digit latch 800, m being the digit width in bits, here equal to four. Each of the four bit intervals—i.e., each digit interval—a digit latch command is issued to digit latch 800 from a global clock generator (800) controlling the timing of bit-serial and digit-serial operations. Digit latch 800 supplies digit-serial signal from its n-bit-wide output port to the m-bit-wide input port of the digital-serial processor 6. Digit-serial processor 6 may receive other digit-serial input data as well such as from a source 601 thereof. Digit-serial processor 6 uses a most significant digit (MSD) flag signal to inform it of the partitioning between the digit-serial words supplied to it.

Where the global clock generator does not supply an MSD flag signal for digit-serial data as well as a most-significant-bit (MSB) flag signal for bit-serial data, the MSD flag signal may be obtained from the MSB flag signal by latching the latter in a latch 601 responsive to digit latch command. The MSB flag signal to accompany digit-serial-to-bit-serial converter 9 bit-serial output signal is obtained by delaying the MSB flag signal accompanying bit-serial input signal to bit-serial-to-digit-serial converter 8, the delaying being done in a delay compensation network 603 having a latency equal to the combined latencies of elements 8, 6 and 9.

The converter 9 converting digit-serial output signal from digit-serial processor 6 to bit-serial form can be a converter having the same structural elements 30–37 as the FIG. 11 converter. Here the latch command to the multiplexers 30–33 issues every digit interval of a digit-serial signal.

An alternative form of the converter 9 uses m tri-state drivers commutating the digit-serial output of digit-serial processor 6 onto a single output line at a bit-serial clocking rate m times the digit-serial clock rate through processor 6. An alternative form of converter 8 may use delay latches clocked in successive bit phases to operate as a commutator, for acquiring bits for each digit, followed by parallelly clocked delay latches to temporally align the bits in each digit.

Converting bit-serial data to digit-serial data for processing may be done where calculations are to be done based on bit-serial input data and digit-serial input data. Indeed, where different input data are in bit-serial format and parallel word format, respectively, one will often find that converting both for processing in a digit-serial format provides the best overall design in terms of throughput efficiency.

FIG. 28 shows a system wherein different ones of cascaded operations are each performed by digit-serial processors, but one operation is done optimally using m-bit-wide digits in a processor 17 and the other operation is done optimally using k-bit-wide digits in a processor 170. Each of the numbers m and k is a different integer submultiple of n, the number of bits per data word. Digit-serial processor 17 is preceded by a parallel-to-digit serial converter 16 that converts parallel input data to m-bit-wide digits as input signal to processor 17; and digit-serial processor 170 is followed by a digit-serial-to-parallel converter 180 that converts the k-bit-wide digits, supplied as output signal from processor 170, to n-bit-wide parallel output data. The m-bit-wide digit-serial input signal for processor 170 is a digit-serial-to-digit-serial converter 160. The nature of the digit-serial-to-digit-serial converter 160 is the primary concern in understanding the operation of the FIG. 28 system.

If k is not a submultiple of m nor is m a submultiple of k, converter 160 is best implemented as a cascade of two converters. A cascade connection of a digit-serial-to-parallel converter and a subsequent parallel-to-digit-serial converter is usually preferred since digit-serial clock rates generally approach system limits. However, in some instances, where clocking rates do not become excessive, the cascade connection of a digit-serial-to-serial converter followed by a serial-to-digit-serial converter may be employed.

If m is a multiple of k, converter 160 may take a form similar to that shown in FIG. 10 with latch command being supplied at the digit rate of the m-bit-wide digits, rather than at word rate. If k is a multiple of m, converter 160 may take the form shown in FIG. 12 with latch command being supplied at the digit rate of the k-bit-wide digits, rather than at word rate.

In any of the foregoing cases, the converter 160 can include means to convert the most significant digit indications accompanying the m-bit-wide digits to the most significant digit indications that are to accompany the k-bit-wide digits, rather than each of the processors 17 and 170 being separately controlled from a global clocking system. When k is a multiple of m, the most significant digit indication for the k-bit-wide digits can be secured by a data latch clocked at the k-bit-wide digit rate connected to respond to the most significant digit indication for the m-bit-wide digits. The most significant digit indication for the k-bit-wide digits is then temporally aligned with the last of these digits in each data word.

When m is a multiple of k, the most significant digit indication for the more frequently occurring m-bit-wide digits can be secured by enabling a counter counting at k-bit-wide digit rate with the most significant digit indication for the m-bit-wide digits, then decoding the count associated with proper timing of the most significant digit indication for the k-bit-wide digits. This procedure is somewhat complex and, if the successive operating can be arranged so as to do the higher digit rate processing first, it is generally preferable to do so. Or one can arrange to use one specific phase of the k-bit-wide digit rate to time the generation of the most significant digit indications for the m-bit-wide digits, to supply that phase of clock and those indications to a two-input AND gate, to latch the AND gate response at k-bit-wide digit rate, and to re-time the latch response to generate the most-significant-digit indications for the k-bit-wide digits.

While the present invention has been described and exemplified in terms of binary addition and digital filters, the present invention is not limited thereto. In particular, the present invention is applicable to a wide variety of digital operators including shift registers, multipliers, non-restoring dividers, logic functions and the like.

While the invention has been described in detail herein in accord with certain preferred embodiments thereof, many modifications and changes therein may be effected by those skilled in the art and informed of the invention as described in the foregoing specification. Accordingly, it is intended for the appended claims to cover all such modifications and changes as fall within the true spirit and scope of the invention.

The invention claimed is:

1. A system for processing digital data, said system comprising:
   a parallel-to-digital converter for converting each of a number of streams at least one on n-bit-wide parallel words each to m-bit-digit digit-serial format, n and m being respective integers that are relatively larger and smaller and that are each greater than one;
   digit-serial processing means for processing the converted words to generate an output signal in m-bit-digit digit-serial format; and
   a digit-serial-to-parallel converter for converting said output signal to parallel words.

2. A system for processing digital data, said system comprising:
   means for converting a parallel digital data stream signal having a width of n bits into a digit-serial data stream signal with a width of m bits, where m and n are respective positive integers each larger than one and m is less than n;
   digit-serial processing means for receiving said m bit-wide digit-serial data stream signal and for processing said m-bit-wide signal in m bit serial portions to produce an m bit digit-serial data output signal, said value of m being selected to substantially optimize throughout efficiency; and means for receiving and for converting said m bit digit-serial data output signal from said processing means to a parallel digital data stream having a width of n bits.

3. The system of claim 2 in which n=24 and m is selected from the group consisting of 3, 4, 6, 8 and 12.

4. The system of claim 2 in which n=16 and m is selected from the group consisting of 4 and 8.

5. The system of claim 2 in which n=12 and m is selected from the group consisting of 4 and 6.

6. The system of claim 2 in which n=3 and m=4.

7. The system of claim 2 in which said digit serial processing means is a binary adder.

8. The system of claim 2 in which said digit-serial processing means is a digital filter.

9. A system for processing digital data, said system comprising:
- a source of input data in m-bit-digit digit-serial format, m being a positive plural integer at least three;
- digit-serial processing means for processing said input data to generate output digital data in m-bit-digit digit-serial format; and
- from-digit-serial converter means for converting from an m-bit-digit digit-serial format to a different digital format connected for converting the output digital data from said digit-serial processing means to said different digital format.

10. A system as set forth in claim 9 wherein said different digital format is a parallel-word format.

11. A system as set forth in claim 9 wherein said different digital format is a bit-serial format.

12. A system as set forth in claim 9 wherein said different digital format is a k-bit-digit digit-serial format, where k is a positive plural integer different from m.

13. A system as set forth in claim 9 wherein said digit-serial processing means is a digital filter.

14. A system for processing digital data, said system comprising:
- a source of input data in m-bit-digit digit-serial format, m being an integer greater than one;
- digit-serial processing means for processing said input data to generate output digital data in m-bit-digit digit-serial format; and
- digit-serial-to-parallel converter means for converting, from an m-bit-digit digit-serial format to parallel-word format, said output digital data.

15. A system as set forth in claim 14 wherein said digit-serial processing means is a digital filter.

16. A system for processing digital data, said system comprising:
- means for converting and splitting a parallel-bit input data stream signal having a width of n bits into a plurality of input digit-serial data stream signals, n being a positive integer;
- a plurality of processing means for separately receiving respective ones of said input digit-serial data stream signals to produce a plurality of output digit-serial data stream signals; and
- means for receiving and recombining said plurality of output digit-serial data stream signals into a single parallel-bit output data stream signal.

17. The system of claim 16 in which said single parallel-bit output data stream signal from said receiving and recombining means is n bits wide.

18. The system of claim 16 in which said digital serial data stream signals are each m bits wide where m is a positive integer that is less than n.

19. The system of claim 18 in which m is an integral factor, or submultiple, of n.

20. The system of claim 18 in which at least one of said plurality of processing means processes m-bit-digit digit-serial stream signals, where m is selected to substantially optimize throughput efficiency.

21. A system for processing digital data, said system comprising:
- a first plural-phase parallel-to-digit-serial converter for separating a first succession of n-bit-wide parallel words into a plurality p in number of m-bit-wide digit-serial signals respectively identified by consecutive ordinal numbers first through $p^{th}$, m being a positive plural integer, n being a positive plural integer that is a multiple of m, and p being a positive plural integer;
- a plurality p in number of means for processing digit-serial signals respectively identified by consecutive ordinal numbers first through $p^{th}$, each of which means for processing has as a first input signal thereto that m-bit-wide digit-serial signal identified by the same ordinal number that means for processing is, and which means for processing generate respective m-bit-wide digit-serial responses responsive to their input signals; and
- a plural-phase digit-serial-to-parallel converter for combining the digit-serial responses of said first through $p^{th}$ means for processing digit-serial signals to generate a combined n-bit-wide parallel-word response.

22. A system as set forth in claim 21 including:
- a second plural-phase parallel-to-digit-serial converter for separating a second succession of n-bit-wide parallel words into p m-bit-wide digit-serial signals respectively identified by consecutive ordinal numbers $(p+1)^{th}$ through $2p^{th}$, each of these signals being supplied as a second input signal to the one of said means for processing digit-serial signals identified by the ordinal number p lower than that signal.

23. A system as set forth in claim 22 wherein each of said means for processing digit-serial signals is an adder.

24. A system as set forth in claim 22 wherein each of said means for processing digit-serial signals is a digit-serial multiplier.

25. A system as set forth in claim 21 wherein said plurality of means for processing digit-serial signals form a plural-phase digital filter.

26. A system as set forth in claim 25 wherein each of said plurality of means for processing digit-serial signals receives at least one further input signal which is responsive to one of said first through $p^{th}$ signals identified by an ordinal number different from that means for processing digit-serial signals.

27. A system as set forth in claim 25 wherein said plural-phase filter has finite impulse response.

28. A system as set forth in claim 25 wherein said plural-phase filter is output-weighted.

29. A system for processing digital data, said system comprising:
- means for converting a parallel digital data stream input signal having a width of n bits into a plurality p in number of m-bit-wide digit-serial streams, m being a positive integer, n being a positive integer that is a multiple of n, and p being a positive integer that is no larger than n/m;
- a p-phase digit-serial filter receiving said p in number m-bit-wide digit serial streams as respective phases of its digit-serial input signal and generating p in number m-bit-wide digit-serial streams as respective phases of its digit-serial output signal; and means for converting the p in number phases of the digit-serial output signal of said p-phase digit-serial filter to a parallel digital data stream output signal.

30. A system for processing digital data as set forth in claim 29 wherein p equals n/m.

31. A method for improving the throughput efficiency of digital calculations in digital hardware, comprising the steps of:

placing digital data in a digit-serial format wherein a succession of m-bit-wide digits is used to describe each word of said digital data, m being a plural integer at least three, the first digit of a word containing its m least significant bits and each successive digit of a word containing m progressively more significant bits of that word the bit order within each digit being determined in accordance with the significance of the bits;

providing indications when a particular digit of each word occurs in said succession of m-bit-wide digits; and performing arithmetic operations on the digital data in said digit-serial format, using said indications to determine the boundaries between words.

32. A method as set forth in claim 31 wherein indications are provided when the last digit of each word occurs in said succession of m-bit-wide digits.

33. A method for improving the throughput efficiency of digital calculations in digital hardware, comprising the steps of:

beginning with a succession of n-parallel-bit words respectively identified by consecutive ordinal numbers modulo p, n being a positive integer that is a multiple of a number m that is a positive plural integer, and p being a positive plural integer;

converting each of the p sets of successive n-parallel-bit words identified by the same ordinal number modulo p to a respective stream of m-bit-wide digit-serial words;

processing the resulting p streams of m-bit-wide digit-serial words to generate a plurality p of further streams of digit-serial words;

converting, word by word, to n-parallel-bit words, each further stream of digit-serial words on a time-interleaved basis with the converting of each other further stream of digit-serial words.

34. The method set forth in claim 33 wherein each of said resulting p streams of m-bit-wide digit-serial words is processed separately from the others to generate a respective one of said p further streams of digit-serial data.

35. The method set forth in claim 33 where the processing of said resulting p streams of m-bit-wide digit-serial words is of a type wherein digit-serial words from more than one of said p streams are combined in generating at least one said further stream of digit serial data.

36. The method set forth in claim 33 wherein the processing of said resulting p streams of m-bit-wide digit-serial words is of a type wherein digit-serial words from more than one of said p streams are combined in generating each further stream of digit serial data.

* * * * *